United States Patent

Ueno

(10) Patent No.: US 8,767,106 B2
(45) Date of Patent: Jul. 1, 2014

(54) COMPARATOR, AD CONVERTER, SOLID-STATE IMAGING DEVICE, AND CAMERA SYSTEM

(71) Applicant: Sony Corporation, Tokyo (JP)

(72) Inventor: Yosuke Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 34 days.

(21) Appl. No.: 13/653,008

(22) Filed: Oct. 16, 2012

(65) Prior Publication Data

US 2013/0100326 A1    Apr. 25, 2013

(30) Foreign Application Priority Data

Oct. 21, 2011 (JP) .................... 2011-232283

(51) Int. Cl.
*H04N 3/14* (2006.01)
*H01L 27/00* (2006.01)

(52) U.S. Cl.
USPC ........... 348/300; 348/302; 348/308; 341/155; 250/208.1

(58) Field of Classification Search
USPC ......... 348/300, 302, 308; 250/208.1; 341/155
See application file for complete search history.

(56) References Cited

U.S. PATENT DOCUMENTS

| | | | | |
|---|---|---|---|---|
| 7,136,005 | B1 * | 11/2006 | Lyden et al. | 341/166 |
| 8,072,527 | B2 * | 12/2011 | Kusuda | 348/308 |
| 8,149,309 | B2 * | 4/2012 | Tanaka | 348/300 |
| 8,339,490 | B2 * | 12/2012 | Wakabayashi et al. | 348/294 |
| 8,358,361 | B2 * | 1/2013 | Hasegawa | 348/300 |
| 8,558,160 | B2 * | 10/2013 | Levine et al. | 250/208.1 |
| 8,598,901 | B2 * | 12/2013 | Hiyama et al. | 324/750.3 |
| 2013/0182164 | A1 * | 7/2013 | Duggal et al. | 348/302 |

FOREIGN PATENT DOCUMENTS

| | | |
|---|---|---|
| JP | 2010-093641 | 4/2010 |
| JP | 2011-159958 | 8/2011 |

* cited by examiner

*Primary Examiner* — Ngoc-Yen Vu
(74) *Attorney, Agent, or Firm* — Rader, Fishman & Grauer PLLC

(57) ABSTRACT

Disclosed herein is a comparator including: a first input sampling capacitance; a second input sampling capacitance; an output node; a transconductance (Gm) amplifier as a differential comparator section configured to receive a slope signal, a signal level of the slope signal changing with a slope, at one input terminal of the Gm amplifier via the first input sampling capacitance, and receive an input signal at another input terminal of the Gm amplifier via the second input sampling capacitance, and subject the slope signal and the input signal to comparing operation; and an isolator configured to hold a voltage of an output section of the Gm amplifier constant, the isolator being disposed between the output section of the Gm amplifier and the output node.

19 Claims, 29 Drawing Sheets

FIG. 10
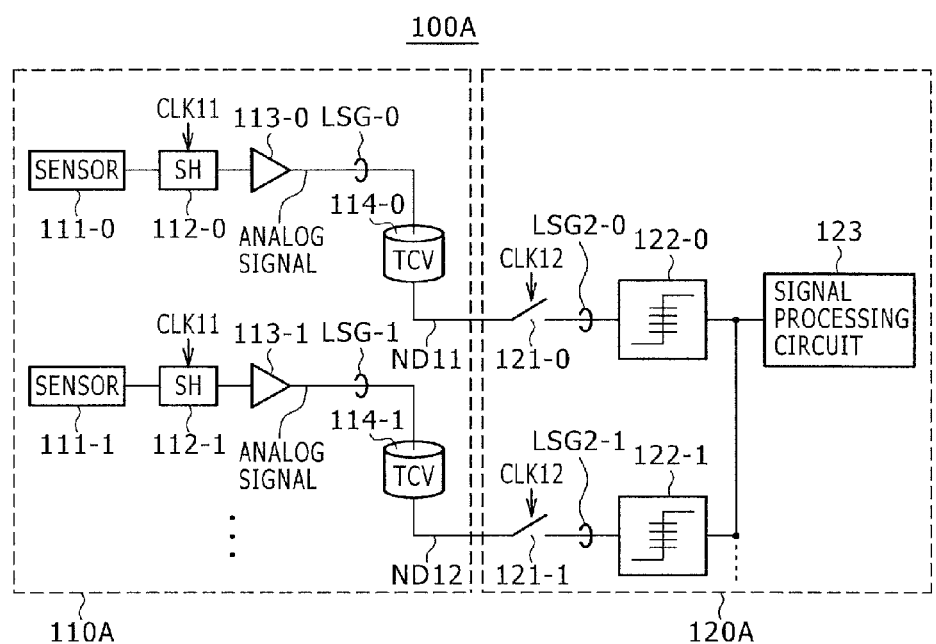
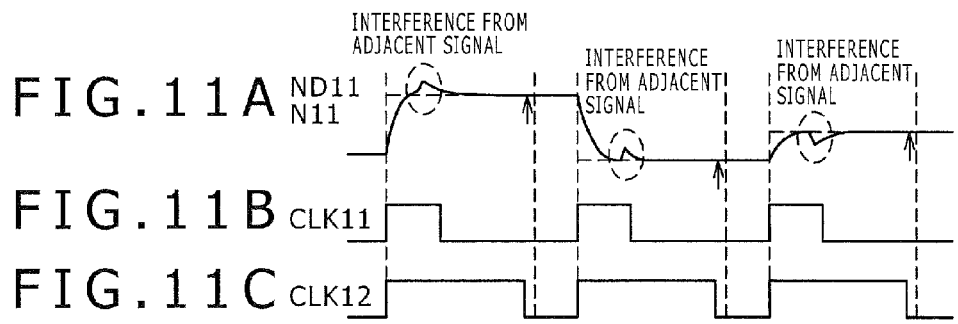
FIG. 11A ND11/N11
FIG. 11B CLK11
FIG. 11C CLK12

COMPARATOR, AD CONVERTER, SOLID-STATE IMAGING DEVICE, AND CAMERA SYSTEM

BACKGROUND

The present technology relates to a comparator, a single slope type AD (analog-digital) converter, a solid-state imaging device typified by a CMOS (complementary metal-oxide semiconductor) image sensor, and a camera system.

There has been an increasing desire for the sophistication of signal processing and miniaturization of semiconductor devices having a structure in which a plurality of sensors are arranged in the form of an array, such as CMOS image sensors and the like.

In order to realize this, Japanese Patent Laid-Open No. 2011-159958, for example, proposes a method of integrating larger signal processing circuits with a chip size equal to that in the past by forming chips into a laminated structure.

Such a semiconductor device has a laminated structure of a chip including a sensor array for generating an analog signal (which chip will hereinafter be described as an analog chip) and a chip including a logic circuit for signal processing (which chip will hereinafter be described as a digital chip).

The miniaturization of the semiconductor device is achieved by vertically laminating these chips in a structure in which connection is established by TC(S)Vs (Through Contact (Silicon) VIAs) formed in the analog chip.

When the miniaturization is achieved by such a method, there is a problem of how to allocate circuit blocks relating to signal paths for passing data output from the sensor array to the upper and lower chips.

In a system as described above, the number of pieces of wiring for extracting signals from the sensor array is of the same order as the number of pixels in a vertical or horizontal direction in an image sensor, for example, and is thus a few thousand or more.

Therefore, when TCVs are inserted into these paths, the TCVs may inevitably need to be arranged densely. Hence, when the signal of a TCV adjacent to a certain TCV makes a transition with a large amplitude, the signal of the TCV of interest is subjected to interference, and an error occurs.

Measures against this interference have been made in the past by limiting signals transmitted via TCVs to signals quantized in a voltage direction (one or a plurality of binary signal lines are used).

Details of these measures will be described in the following.

The following description will first be made of measures in which transmission signals passing through TCVs are temporally discrete and quantized signals, that is, digital signals, and secondly be made of a case in which transmission signals passing through TCVs are temporally continuous but quantized signals.

Description will first be made of measures in which transmission signals passing through TCVs are temporally discrete and quantized signals, that is, digital signals.

FIG. 1 is a diagram showing a first example of configuration of a semiconductor device using a laminated chip in which transmission signals passing through TCVs are temporally discrete and quantized signals.

The semiconductor device 1 has a laminated structure of an analog chip 2 and a digital chip 3.

The semiconductor device 1 has a plurality of sensors 4 (-0, -1, . . . ) arranged in the form of an array on the analog chip 2 manufactured by using an analog process, the analog chip 2 being one of the chips of the laminated structure.

Sampling switches 6 (-0, -1, . . . ) for temporally discretizing signals are connected to the respective outputs of the sensors 4 via amplifiers 5 (-0, -1, . . . ).

In this case, when the signals output from the sensors 4 as sources have sufficiently high power, the outputs of the sensors may be directly connected to the sampling switches without the interposition of the amplifiers.

The signals temporally discretized by the sampling switches 6 are quantized in a voltage direction by using quantizers 7 (-0, -1, . . . ).

The quantizers 7 are formed by a plurality of comparators. Each of the comparators quantizes the signal by comparing a certain signal level with the level of the input signal.

In this case, the quantizers 7 may not complete the quantization at a time, but may be a circuit composed of a plurality of stages.

The signals digitized in such a process are transmitted to the digital chip 3 via TCVs 8 (-0, -1, . . . ), and processed by a digital signal processing circuit 9.

In this case, the signals passing through the TCVs 8 are binarized into a power supply level or a ground (GND) level, and cause no error unless the signals change by a magnitude of about half of a power supply voltage. In addition, even if a signal delay occurs due to the parasitic capacitance of the TCVs 8, no problem is presented when the signal delay is within a setup margin of the signal processing circuit 9.

Description will next be made of another example of configuration in which signals transmitted via TCVs are digital signals.

FIG. 2 is a diagram showing a second example of configuration of a semiconductor device using a laminated chip in which transmission signals passing through TCVs are temporally discrete and quantized signals.

In the semiconductor device 1A in this case, the output signals of sensors 4 are not directly discretized temporally by sampling switches 6, but are temporally discretized by SH (sample and hold) circuits 10 (-0, -1, . . . ) nearest to the sensors 4.

The sample and hold circuits 10 in a simplest form are realized by a switch and a capacitance only.

Description will next be made of a case where the example of configuration of FIG. 2 in which the signals transmitted via the TCVs are digital signals is applied to an image sensor.

FIG. 3 is a diagram showing a third example of configuration of a semiconductor device using a laminated chip in which transmission signals passing through TCVs are temporally discrete and quantized signals, and is a diagram showing an example in which the example of configuration of FIG. 2 is applied to a CMOS image sensor.

Incidentally, in FIG. 3, the same constituent parts as in FIG. 1 and FIG. 2 are identified by the same reference numerals in order to facilitate understanding.

A mainstream CMOS image sensor is of a column-parallel output type in which the CMOS image sensor has an FD amplifier in each pixel and one row in a pixel array is selected to read out the outputs of the row in a column direction simultaneously.

This is because it is difficult to obtain a sufficient driving capability with the FD amplifier disposed within the pixel and it is therefore necessary to lower a data rate, to which parallel processing is considered to be advantageous.

Such a CMOS image sensor 20 includes a pixel array section 21 as a sensor array and a row selecting circuit (V-scanner) 22 for driving the pixels.

The pixel array section 21 has pixel circuits 30 arranged in the form of a matrix with M rows and N columns.

The row selecting circuit 22 controls the operation of pixels arranged in an arbitrary row in the pixel array section 21. The row selecting circuit 22 controls the pixels through control lines LSEL, LRST, and LTRG.

FIG. 3 represents a case where a pixel circuit 30 is formed with four transistors as an example.

The pixel circuit 30 includes a photoelectric conversion element 31 formed by a photodiode (PD), for example (which photoelectric conversion element may hereinafter referred to simply as a PD). The pixel circuit 30 includes four transistors, that is, a transfer transistor 32, a reset transistor 33, an amplifying transistor 34, and a selecting transistor 35 as active elements for the one photoelectric conversion element 31.

In the CMOS image sensor 20, the functions of a sample and hold circuit in the block diagram of FIG. 2 are realized by a floating diffusion (capacitance) FD and the transfer transistor (transfer switch) 32 for the photoelectric conversion element (photodiode) 31 as a sensor.

Description will secondly be made of a case in which transmission signals passing through TCVs are temporally continuous but quantized signals.

FIG. 4 is a diagram showing a first example of configuration of a semiconductor device using a laminated chip in which transmission signals passing through TCVs are temporally continuous but quantized signals.

The semiconductor device 1C of FIG. 4 converts analog signals output from sensors 4 into signals on a time axis by comparing signals discretized by SH circuits 10 as in the semiconductor device 1A of FIG. 2 with a ramp wave generated by a ramp signal generator not shown in the figure in comparators 23 (–0, –1, . . . ).

The quantized sensor signals thus converted are transmitted to a digital chip 3C via TCVs 8, and the information on the time axis is quantized by counters (TDC) 24, whereby digital signals are obtained.

The above operation is shown by waveforms on the time axis as in FIG. 5.

A result of comparison between an analog signal and the ramp wave RAMP is output as a signal S23 from a comparator 23, thereby stopping the counting operation of a counter 24, and determining a signal. In this case, the start timing of the ramp wave RAMP and the start time of the counting operation of the counter 24 are synchronized with each other. Thus, this operation converts voltage information into temporal information.

When such a transmission method is used, the signals passing through the TCVs 8 are quantized into a power supply level/GND level as in the case where the signals transmitted via the TCVs are digital signals.

FIG. 6 is a diagram showing an example in which the configuration of FIG. 4 in the semiconductor device using the laminated chip is applied to a CMOS image sensor.

Incidentally, in FIG. 6, the same constituent parts as in FIG. 3 and FIG. 4 are identified by the same reference numerals in order to facilitate understanding.

As in the case of FIG. 4, analog signals output from pixels 30 are converted into signals on a time axis by comparing a ramp wave generated by a ramp signal generator 25 in comparators 23 (–0, –1, . . . ).

The quantized sensor signals thus converted are transmitted to a digital chip 3D via TCVs 8, the information on the time axis is quantized by counters (TDC) 24, and the resulting digital signals are retained by latches (memories) 26.

The digital signals retained by the latches 26 are horizontally transferred through a transfer line by a signal processing circuit 9.

Incidentally, a so-called single slope type AD converter (ADC) is formed by a comparator 23, a counter 24, and a latch 26 disposed in each column.

FIG. 7 is a diagram showing a configuration of an ordinary single slope type AD converter.

The single slope type AD converter 40 in FIG. 7 includes a comparator 41, a counter 42, and a ramp signal generator 43.

As described above, the single slope type AD converter 40 performs AD conversion by comparing a ramp wave (slope signal) from the ramp signal generator 43 such as a DAC or the like with an AD converter input signal IN in the comparator 41 and controlling the counter 42 in a subsequent stage.

There is a noise characteristic as an important performance index of the AD converter 40. The noise characteristic of the comparator 41 often governs the noise characteristic of the AD converter 40. Noise includes thermal noise, which is noise in a wide band, and flicker noise, RTS (Random-Telegraph-Signal) noise, and the like as low-frequency noise. These noises each degrade the noise characteristic.

A method of increasing transistor size and a method of inserting a mirror capacitance into the first-stage output of a comparator (see Japanese Patent Laid-Open No. 2010-93641) are generally known as methods for reducing these noises.

SUMMARY

However, the following problems are presented in the cases where the signals passing through the TCVs are digital signals as in FIGS. 1 to 3 described above.

First, the number of TCVs is increased when the resolution of the quantizers is to be raised.

As described earlier, the number of sensors (pixels) from which readout is performed simultaneously in an image sensor is generally a few thousand. When this measure is taken, a number of TCVs which number is obtained by multiplying the few thousand by the resolution (number of bits) are necessary, which consequently invites an unwanted increase in area/cost.

Second, the signals passing through the TCVs are increased in amplitude. This means that the TCVs having a higher parasitic capacitance than ordinary vias are charged with a large signal amplitude, thus inviting an increase in power and an increase in power supply noise.

Third, the quantizers themselves require a large area. The analog chip is generally manufactured by processes including special processes as compared with the digital chip, in order to implement sensors. The analog chip thus involves high cost per area. Hence, an increase in area of the analog chip greatly affects the cost.

In addition, the following problems occur in the cases where the signals passing through the TCVs are temporally continuous and quantized signals as in FIG. 4 and FIG. 6.

First, there is interference by a signal from an adjacent TCV. Because the signals passing through the TCVs are binary signals at a power supply level/GND level, interference with adjacent signals tends to occur.

In this system, when the output of a comparator is sufficiently determinate statically and is close to a power supply level/GND level, the output of the comparator is not easily affected by interference from an adjacent TCV. However, the output of the comparator is never insusceptible to the interference while making a transition.

This is because the output of the comparator has a finite rise time, and when noise is superimposed on the signal, an error occurs in a time to cross a certain level.

FIG. 8 is a diagram showing the effect of an error due to interference from the adjacent TCV.

When there is no interference from the adjacent TCV, the comparator produces an output CMPOUT as indicated by a broken line. However, when there is interference from the adjacent TCV, the comparator produces an output CMPOUT as indicated by a solid line. There is an error ER between times for the two lines to cross a counter threshold value VTH.

In this system, even when the timing of a clock CLK1 for driving the SH circuits is made to be the same, the rising timing of the signal of the comparator changes according to the level of the sensor output, and is therefore difficult to manage to be the same timing.

In addition, for the reasons described above, the error occurs when the output of the adjacent comparator makes a transition substantially simultaneously. Thus, the interference cannot be theoretically avoided in the first place even when the timing is synchronized.

This problem can be alleviated by providing a shield between the TCVs. However, this increases a distance between the TCVs, and consequently results in an increase in area.

Second, there are increases in power and power supply noise due to larger output signals of the comparators. The increases in power and power supply noise occur for the same reasons as in the case of transmission of digital signals.

Third, there is an increase in cost due to the area of the comparators themselves as in the case of transmission of digital signals. As compared with the case of transmission of digital signals, only one time of comparison suffices, and the circuits are simple. Therefore, the increase in cost is correspondingly small as compared with the high-resolution quantizers, but is never negligible because of the number of comparators, which number is equal to the number of TCVs, that is, a few thousand.

As described above, in the semiconductor device processing the signals output from the sensors which semiconductor device has a laminated structure, quantization at voltage levels has been adopted in the past as a measure to suppress signal interference between adjacent TCVs.

Each of the implementation methods described above increases the area of the analog chip involving a large number of processes, thus inviting an increase in cost, and increases the amplitude of the signals transmitted through the TCVs, and therefore involves increases in power and power supply noise.

Further, when a semiconductor device using a single slope type AD converter is considered, the method of increasing transistor size as a method for reducing noise increases parasitic capacitance as a side effect, and therefore increases circuit area and decreases operating speed. Thus, the area of each comparator is increased, and operating speed is limited. In addition, because of these limitations, it is difficult to obtain a noise reducing effect at a certain level or higher.

The method of inserting a mirror capacitance into the first-stage output of the comparator is basically a method of reducing the band of noise, that is, an operating band. Therefore, operating speed is decreased, so that it is difficult to obtain a noise reducing effect at a certain level or higher.

Further, by reason of principles of noise reduction by the band limitation, this method has a small effect on low-frequency noise such as flicker noise, RTS noise, and the like.

Because of these situations, there has always been a desire to achieve further noise reduction in the comparator, or the reduction of low-frequency noise in particular.

It is desirable to provide a comparator, an AD converter, a solid-state imaging device, and a camera system that can achieve the reduction of low-frequency noise as well as further noise reduction.

According to a first embodiment of the present technology, there is provided a comparator including: a first input sampling capacitance; a second input sampling capacitance; an output node; a transconductance (Gm) amplifier as a differential comparator section configured to receive a slope signal, a signal level of the slope signal changing with a slope, at one input terminal of the Gm amplifier via the first input sampling capacitance, and receive an input signal at another input terminal of the Gm amplifier via the second input sampling capacitance, and subject the slope signal and the input signal to comparing operation; and an isolator configured to hold a voltage of an output section of the Gm amplifier constant, the isolator being disposed between the output section of the Gm amplifier and the output node.

According to a second embodiment of the present technology, there is provided an AD converter including: a comparator configured to subject a slope signal, a signal level of the slope signal changing with a slope, and an input signal to comparison and determination, and output a determination signal based on the determination; and a counter configured to count a comparison time of the comparator, and obtain a digital signal; wherein the comparator includes a first input sampling capacitance, a second input sampling capacitance, an output node, a transconductance (Gm) amplifier as a differential comparator section configured to receive the slope signal, the signal level of the slope signal changing with the slope, at one input terminal of the Gm amplifier via the first input sampling capacitance, and receive the input signal at another input terminal of the Gm amplifier via the second input sampling capacitance, and subject the slope signal and the input signal to comparing operation, and an isolator configured to hold a voltage of an output section of the Gm amplifier constant, the isolator being disposed between the output section of the Gm amplifier and the output node.

According to a third embodiment of the present technology, there is provided a solid-state imaging device including: a pixel array section in which a plurality of pixels configured to perform photoelectric conversion are arranged in a form of a matrix; and a pixel signal readout section configured to read out pixel signals in a plurality of pixel units from the pixel array section; wherein the pixel signal readout section includes a plurality of comparators configured to subject a readout signal potential and a slope signal, a signal level of the slope signal changing with a slope, to comparison and determination, and output a determination signal based on the determination, the plurality of comparators being disposed so as to correspond to a column arrangement of the pixels, and a plurality of counters configured to count comparison times of the corresponding comparators, and obtain digital signals, and each of the comparators includes a first input sampling capacitance, a second input sampling capacitance, an output node, a transconductance (Gm) amplifier as a differential comparator section configured to receive the slope signal, the signal level of the slope signal changing with the slope, at one input terminal of the Gm amplifier via the first input sampling capacitance, and receive an input signal at another input terminal of the Gm amplifier via the second input sampling capacitance, and subject the slope signal and the input signal to comparing operation, and an isolator configured to hold a voltage of an output section of the Gm amplifier constant, the isolator being disposed between the output section of the Gm amplifier and the output node.

According to a fourth embodiment of the present technology, there is provided a camera system including: a solid-state imaging device; and an optical system configured to form a subject image on the solid-state imaging device; wherein the solid-state imaging device includes a pixel array section in which a plurality of pixels configured to perform photoelectric conversion are arranged in a form of a matrix, and a pixel signal readout section configured to read out pixel signals in a plurality of pixel units from the pixel array section, the pixel signal readout section includes a plurality of comparators configured to subject a readout signal potential and a slope signal, a signal level of the slope signal changing with a slope, to comparison and determination, and output a determination signal based on the determination, the plurality of comparators being disposed so as to correspond to a column arrangement of the pixels, and a plurality of counters configured to count comparison times of the corresponding comparators, and obtain digital signals, and each of the comparators includes a first input sampling capacitance, a second input sampling capacitance, an output node, a transconductance (Gm) amplifier as a differential comparator section configured to receive the slope signal, the signal level of the slope signal changing with the slope, at one input terminal of the Gm amplifier via the first input sampling capacitance, and receive an input signal at another input terminal of the Gm amplifier via the second input sampling capacitance, and subject the slope signal and the input signal to comparing operation, and an isolator configured to hold a voltage of an output section of the Gm amplifier constant, the isolator being disposed between the output section of the Gm amplifier and the output node.

According to the present technology, it is possible to achieve the reduction of low-frequency noise as well as further noise reduction.

BRIEF DESCRIPTION OF THE DRAWINGS

FIG. 10 is a diagram showing a first example of arrangement and configuration of circuits and the like in a semiconductor device according to the present embodiment;

FIGS. 11A, 11B, and 11C are diagrams showing temporal relation between signals of the semiconductor device according to the present embodiment;

DETAILED DESCRIPTION OF PREFERRED EMBODIMENTS

Preferred embodiments of the present technology will hereinafter be described with reference to the drawings.

Incidentally, description will be made in the following order.
1. Outlines of Semiconductor Device
1.1 First Example of Arrangement and Configuration in Semiconductor Device
1.2 Second Example of Arrangement and Configuration in Semiconductor Device
1.3 Third Example of Arrangement and Configuration in Semiconductor Device
2. Outlines of Solid-State Imaging Device
2.1 Basic Example of Configuration of Solid-State Imaging Device
2.2 Example of Configuration of Solid-State Imaging Device Including Column-Parallel ADCs
2.3 First Example of Arrangement and Configuration in Solid-State Imaging Device
2.4 Second Example of Arrangement and Configuration in Solid-State Imaging Device
2.5 Third Example of Arrangement and Configuration in Solid-State Imaging Device
3. Example of Configuration of Comparator
3.1 Basic Example of Configuration of Comparator
3.2 Basic Example of Configuration of Comparator Capable of Reducing Low-Frequency Noise
3.3 Concrete Example of Circuit Configuration of Comparator Capable of Reducing Low-Frequency Noise
4. Example of Configuration of Camera System <1. Outlines of Semiconductor Device>

Figure 9:
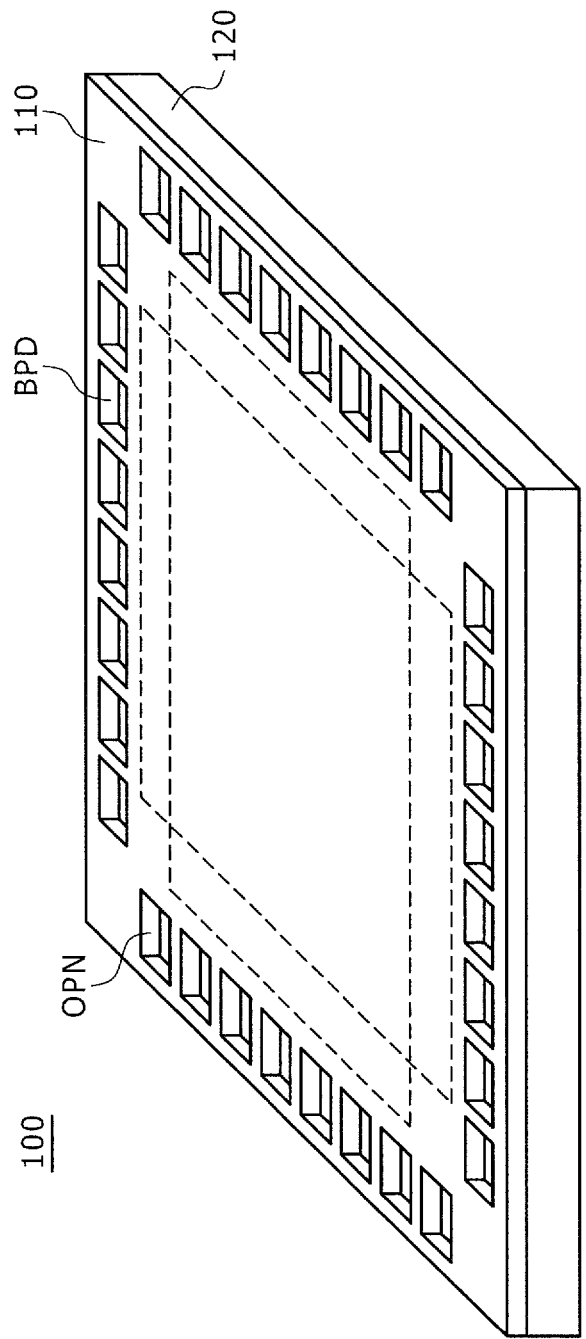
FIG. 9 is a diagram showing an example of a laminated structure of a semiconductor device according to an embodiment of the present technology.

FIG. 9 is a diagram showing an example of a laminated structure of a semiconductor device according to a present embodiment.

The semiconductor device 100 according to the present embodiment has a plurality of sensors arranged in the form of an array, the plurality of sensors including a photoelectric conversion element and the like.

In the following, description will be made of examples of configuration of the semiconductor device having such a configuration, and thereafter description will be made of examples of configuration of a CMOS image sensor as a solid-state imaging device as an example of the semiconductor device. Then, description will be made of a concrete example of configuration of a single slope type AD converter that has a great noise reducing effect and is applicable to a solid-state imaging device.

As shown in FIG. 9, the semiconductor device 100 has a laminated structure of a first chip (upper chip) 110 and a second chip (lower chip) 120.

The first chip 110 and the second chip 120 that are laminated are electrically connected to each other by vias (TCVs) formed in the first chip 110.

The semiconductor device 100 is laminated at a wafer level, and then formed as a semiconductor device of a laminated structure cut out by dicing.

In the laminated structure of the two upper and lower chips, the first chip 110 is formed by an analog chip (sensor chip) in which a plurality of sensor are arranged in the form of an array.

The second chip 120 is formed by a logic chip (digital chip) including a circuit for quantizing an analog signal transferred from the first chip 110 via a TCV and a signal processing circuit.

Bonding pads BPD and an input-output circuit are formed on the second chip 120. Openings OPN for bonding wires to the second chip 120 are formed in the first chip 110.

The semiconductor device 100 having the laminated structure of the two chips according to the present embodiment has the following characteristic configuration.

The electric connection between the first chip 110 and the second chip 120 is established through the vias (TCVs), for example.

The TCVs (vias) are arranged at the edge of the chip or between the pads (PADS) and a circuit region.

For example, TCVs for control signals and power supply concentrate mainly in four parts of corner sections of the chip, so that the signal wiring region of the first chip 110 can be reduced.

In order to deal with a problem of an increase in power supply line resistance and an increase in IR-Drop due to a reduction in the number of wiring layers of the first chip 110, TCVs are arranged effectively, and thereby reinforcement for a measure against noise of the power supply of the first chip 110, stable supply, and the like can be performed using the wiring of the second chip 120.

<1.1 First Example of Arrangement and Configuration in Semiconductor Device>

FIG. 10 is a diagram showing a first example of arrangement and configuration of circuits and the like in a semiconductor device according to the present embodiment.

The semiconductor device 100A in FIG. 10 is shown with a first chip 110A and a second chip 120A developed two-dimensionally in order to facilitate understanding of the arrangement of the circuits and the like of the first chip 110A and the second chip 120A having a laminated structure.

A plurality of sensors 111 (−0, −1, . . . ) arranged in the form of an array and first signal lines LSG1 (−0, −1, . . . ) for transmitting the output analog signals (sensor signals) of the respective sensors 111 (−0, −1, . . . ) are formed in the first chip 110A.

In the first chip 110A, sample and hold (SH) circuits 112 (−0, −1, . . . ) for sampling the sensor signals of the respective sensors 111 (−0, −1, . . . ) by a first clock CLK11 are arranged on the first signal lines LSG1 (−0, −1, . . . ).

Amplifiers 113 (−0, −1, . . . ) for amplifying the sensor signals output by the sample and hold (SH) circuits 112 (−0, −1, . . . ), respectively, are arranged on the first signal lines LSG1 (−0, −1, . . . ).

TVCs 114 (−0, −1, . . . ) for electrically connecting the first signal lines LSG1 (−0, −1, . . . ) to the side of the second chip 120A and transmitting the sensor signals are formed in the first chip 110A.

Incidentally, though not shown, TCVs for power supply and control signals are also formed in the first chip 110A.

Second signal lines LSG2 (−0, −1, . . . ) connected to the respective TCVs 114 formed in the first chip 110A are formed in the second chip 120A.

Sampling switches 121 (−0, −1, . . . ) for sampling the sensor signals transmitted through the TCVs 114 by a second clock CLK12 are arranged on the respective second signal lines LSG2 (−0, −1, . . . ).

Quantizers 122 (−0, −1, . . . ) for quantizing the signals sampled by the sampling switches 121 (−0, −1, . . . ) are arranged on the respective second signal lines LSG2 (−0, −1, . . . ).

A signal processing circuit 123 for subjecting the signals quantized by the respective quantizers 122 (−0, −1, . . . ) to digital arithmetic processing is disposed in the second chip 120A.

In the semiconductor device 100A, the signals output from the respective sensors 111 are sampled and held by the SH circuits 112, and transmitted to the TCVs 114 via the amplifiers 113.

In this case, the amplifiers may be omitted when the signals output from the sensors 111 via the SH circuits 112 have sufficiently high power.

The signals transmitted through the TCVs 114 are sampled by the sampling switches 121 on the second chip 120A as a logic chip (digital chip), and quantized in a voltage direction by using the quantizers 122. The thus digitized data is subjected to arithmetic processing in the signal processing circuit 123.

Figure 1:
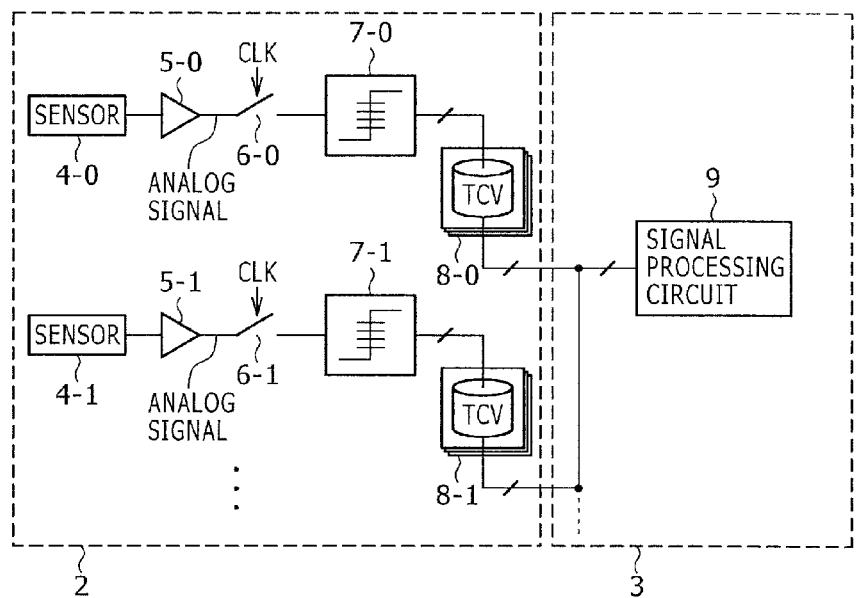
FIG. 1 is a diagram showing a first example of configuration of a semiconductor device using a laminated chip in which transmission signals passing through TCVs are temporally discrete and quantized signals.
Figure 2:
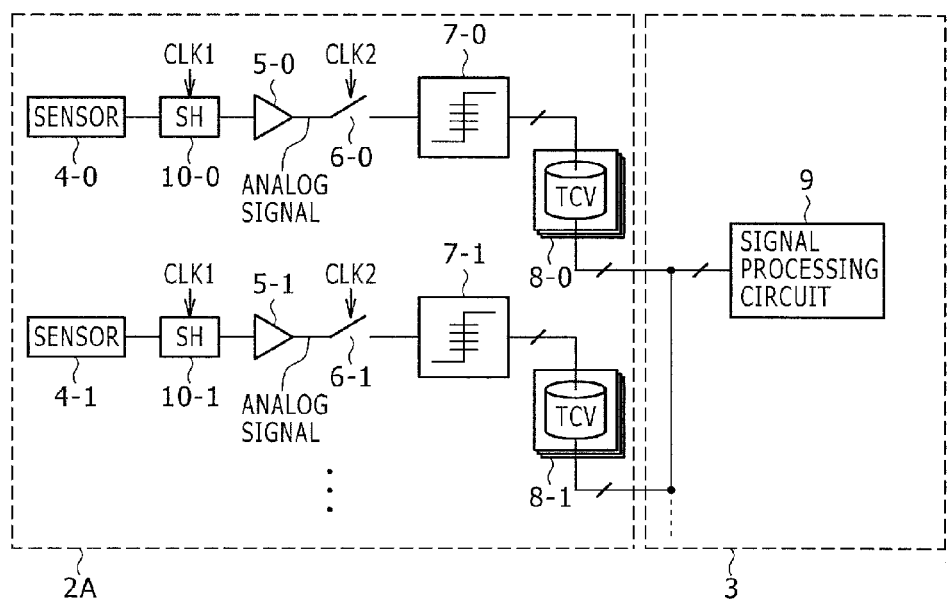
FIG. 2 is a diagram showing a second example of configuration of a semiconductor device using a laminated chip in which transmission signals passing through TCVs are temporally discrete and quantized signals.
Figure 3:
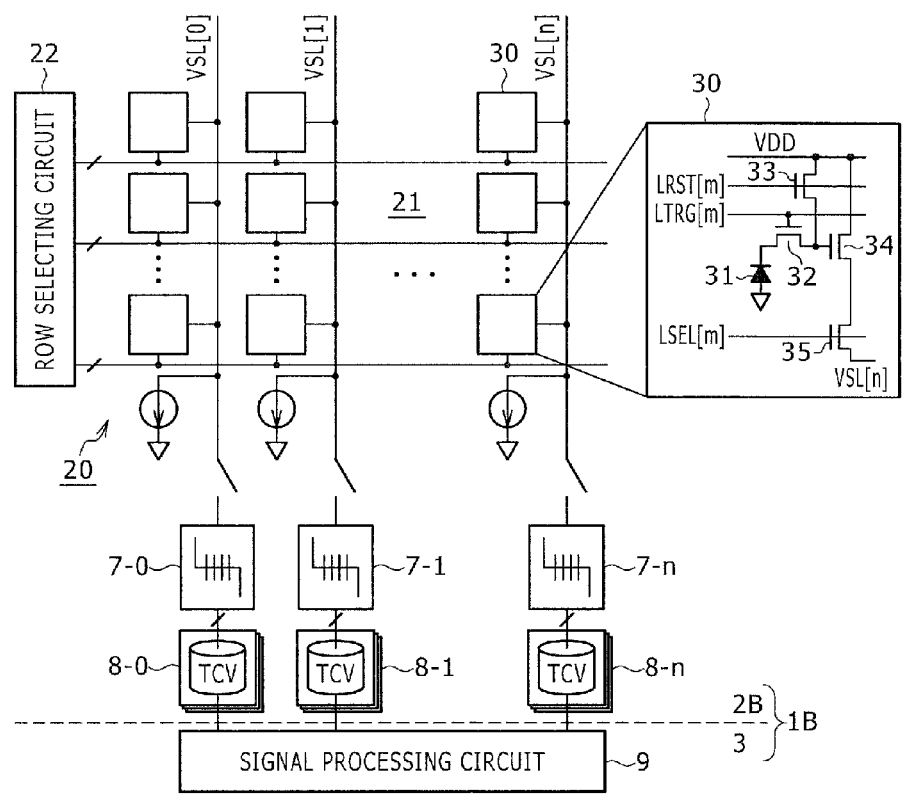
FIG. 3 is a diagram showing a third example of configuration of a semiconductor device using a laminated chip in which transmission signals passing through TCVs are temporally discrete and quantized signals, and is a diagram showing an example in which the example of configuration of FIG. 2 is applied to a CMOS image sensor.
Figure 4:
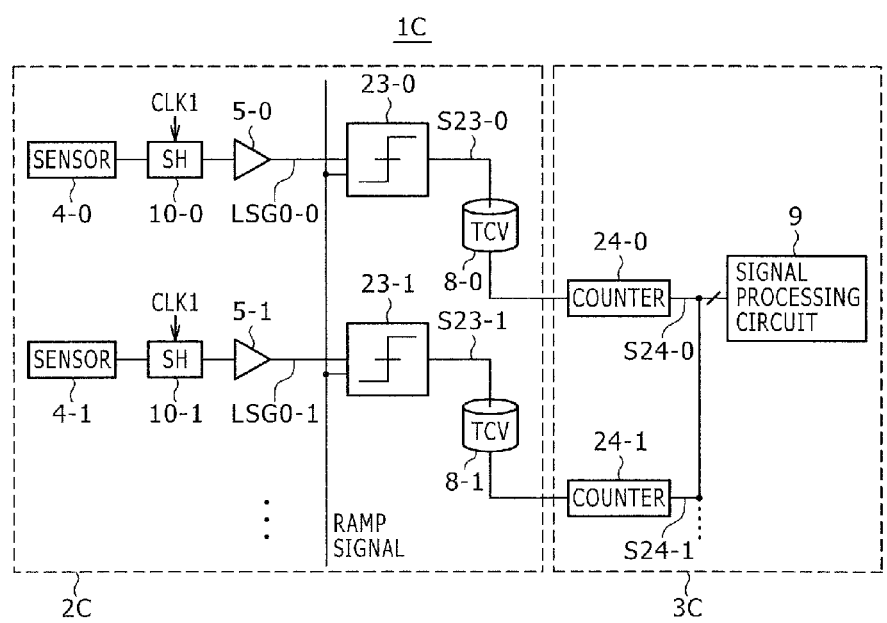
FIG. 4 is a diagram showing a first example of configuration of a semiconductor device using a laminated chip in which transmission signals passing through TCVs are temporally continuous but quantized signals.
Figure 5:
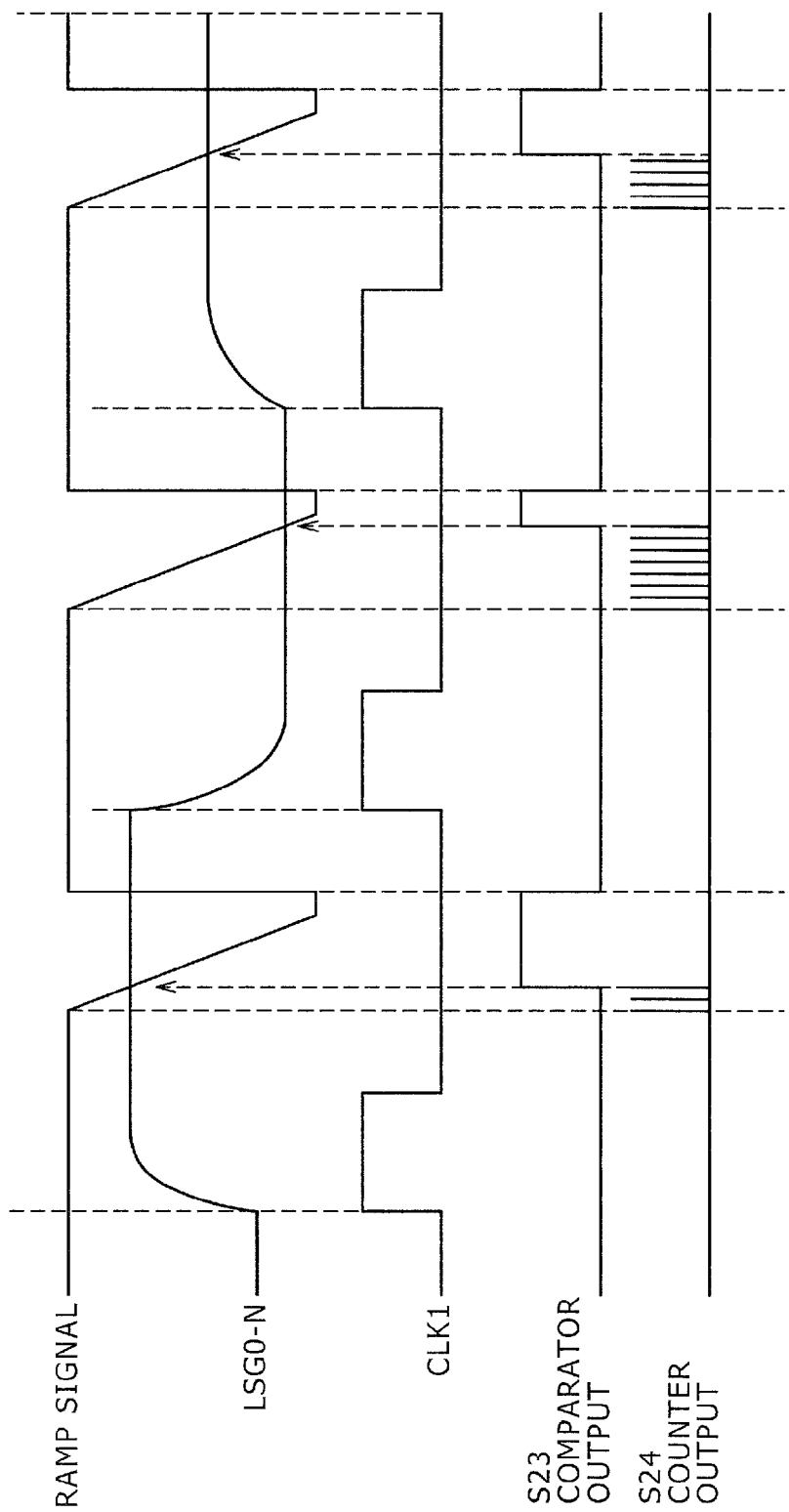
FIG. 5 is a diagram showing the operation of the semiconductor device of FIG. 4 by waveforms on a time axis.
Figure 6:
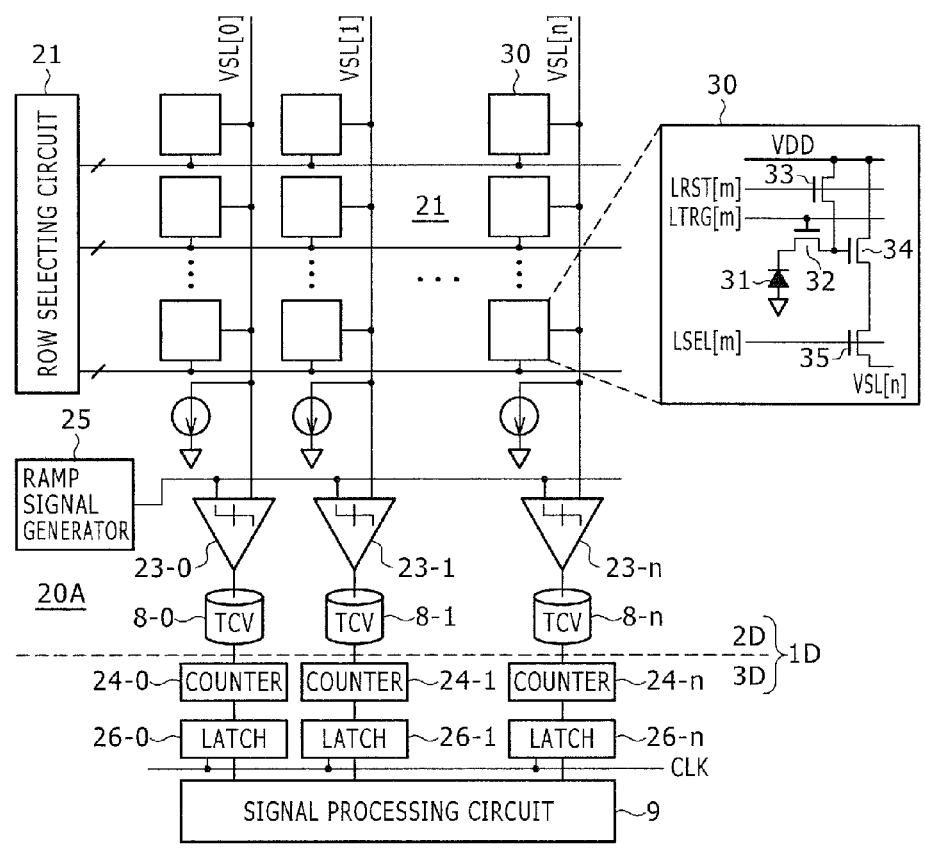
FIG. 6 is a diagram showing a second example of configuration of a semiconductor device using a laminated chip in which transmission signals passing through TCVs are temporally discrete and quantized signals, and is a diagram showing an example in which the configuration of FIG. 4 is applied to a CMOS image sensor.

In the technology shown in FIG. 2, the signals transmitted via the TCVs are signals quantized in the voltage direction.

On the other hand, in the present technology, the signals transmitted through the TCVs 114 are discretized in a temporal direction, and are continuous signals in the voltage direction, that is, discrete time analog signals.

Also in this case, interference of signals from adjacent TCVs 114 occurs.

However, interference between the TCVs can be avoided by properly controlling the timing of the first clock CLK11 for controlling the timing of sampling and holding by the SH circuits 112 and the timing of the second clock CLK12 for sampling the discrete time analog signals on the second chip 120A.

FIGS. 11A to 11C are diagrams showing temporal relation between signals of the semiconductor device according to the present embodiment.

FIG. 11A shows the signal waveform of a node ND11 supplied with a signal transmitted through a TCV. FIG. 11B shows the first clock CLK11. FIG. 11C shows the second clock CLK12.

Attention will now be directed to the node ND11 of the discrete time analog signal transmitted through the TCV 114.

Timing common to the SH circuits 112 connected to all of the sensors 111 is used for the first clock CLK11. Thus, ideally, the signal transitions of the node ND11 and an adjacent node ND12 are temporally synchronized with each other.

However, when timings of output of the signals from the sensors to the node ND11 and the node ND12 are shifted from each other due to a signal wiring delay, for example, barbs caused by interference occur in the signal of the node ND11, as shown in FIG. 11A.

However, the signal during the interval of transmission of one piece of data is already temporally discretized by the SH circuit 112. Thus, the signal during this interval has a constant value, and becomes statically determinate at a desired value after the passage of a sufficient time.

When driving is performed so as to perform sampling using the second clock CLK12 in timing in which the value has become statically determinate sufficiently, an error caused by the interference of the TCV 114 can be reduced to a negligible level.

<1.2 Second Example of Arrangement and Configuration in Semiconductor Device>

Figure 12:
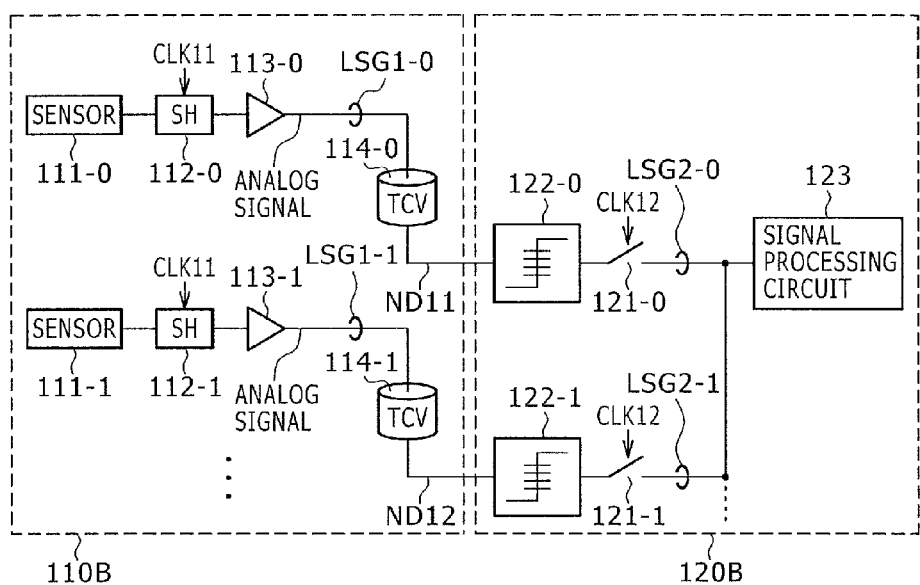
FIG. 12 is a diagram showing a second example of arrangement and configuration of circuits and the like in a semiconductor device according to the present embodiment.

FIG. 12 is a diagram showing a second example of arrangement and configuration of circuits and the like in a semiconductor device according to the present embodiment.

The semiconductor device 100B in FIG. 12 is different from the semiconductor device 100A in FIG. 10 as follows.

In a second chip 120B, the arrangement positions (connection positions) of sampling switches 121 (−0, −1, . . . ) and quantizers 122 (−0, −1, . . . ) arranged on respective second signal lines LSG2 (−0, −1, . . . ) are reversed.

The order of sampling and quantization in the timing of the second clock CLK12 in the present technology may be reversed into for example the order of quantization in a continuous time and the sampling switches 121 connected to the quantizers 122.

In this case, the operation of the sampling switches 121 is realized by providing a flip-flop for each signal.

In the case of the constitution as shown in FIG. 10, kT/C noise may occur when the sampling switches 121 are in an off state (turned off), and this noise may become a problem. However, the kT/C noise does not occur in the case of the configuration of FIG. 12.

<1.3 Third Example of Arrangement and Configuration in Semiconductor Device>

Figure 13:
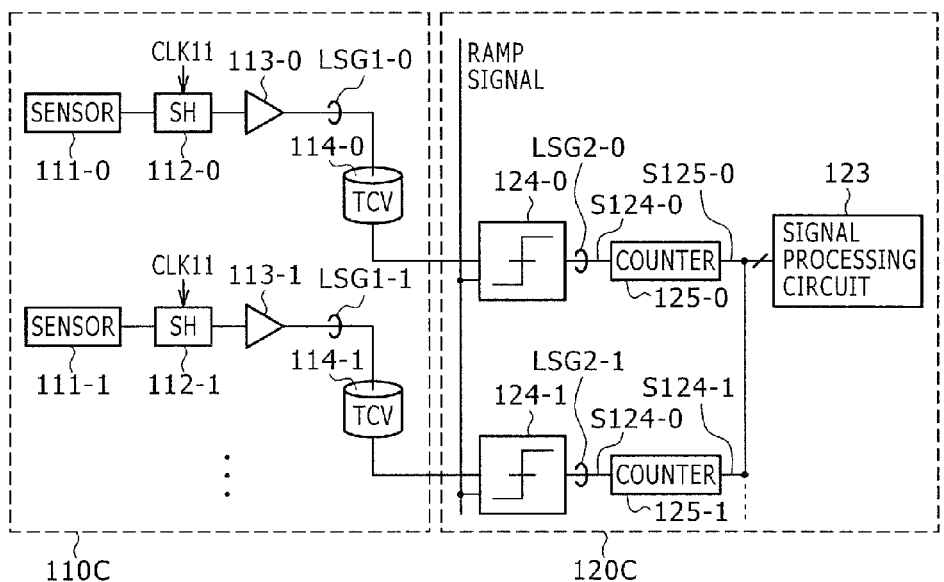
FIG. 13 is a diagram showing a third example of arrangement and configuration of circuits and the like in a semiconductor device according to the present embodiment.

FIG. 13 is a diagram showing a third example of arrangement and configuration of circuits and the like in a semiconductor device according to the present embodiment.

The semiconductor device 100C in FIG. 13 is different from the semiconductor devices 100A and 100B in FIG. 10 and FIG. 12 as follows.

In a second chip 120C, comparators 124 (−0, −1, . . . ) and counters 125 (−0, −1, . . . ) are provided in place of the sampling switches and the quantizers.

In the second chip 120C, sensor signals transmitted via TCVs 114 are compared with a ramp signal RAMP by the comparators 124 to be converted from a voltage axis to a time axis, and the temporal information is quantized by the counters 125.

Figure 14:
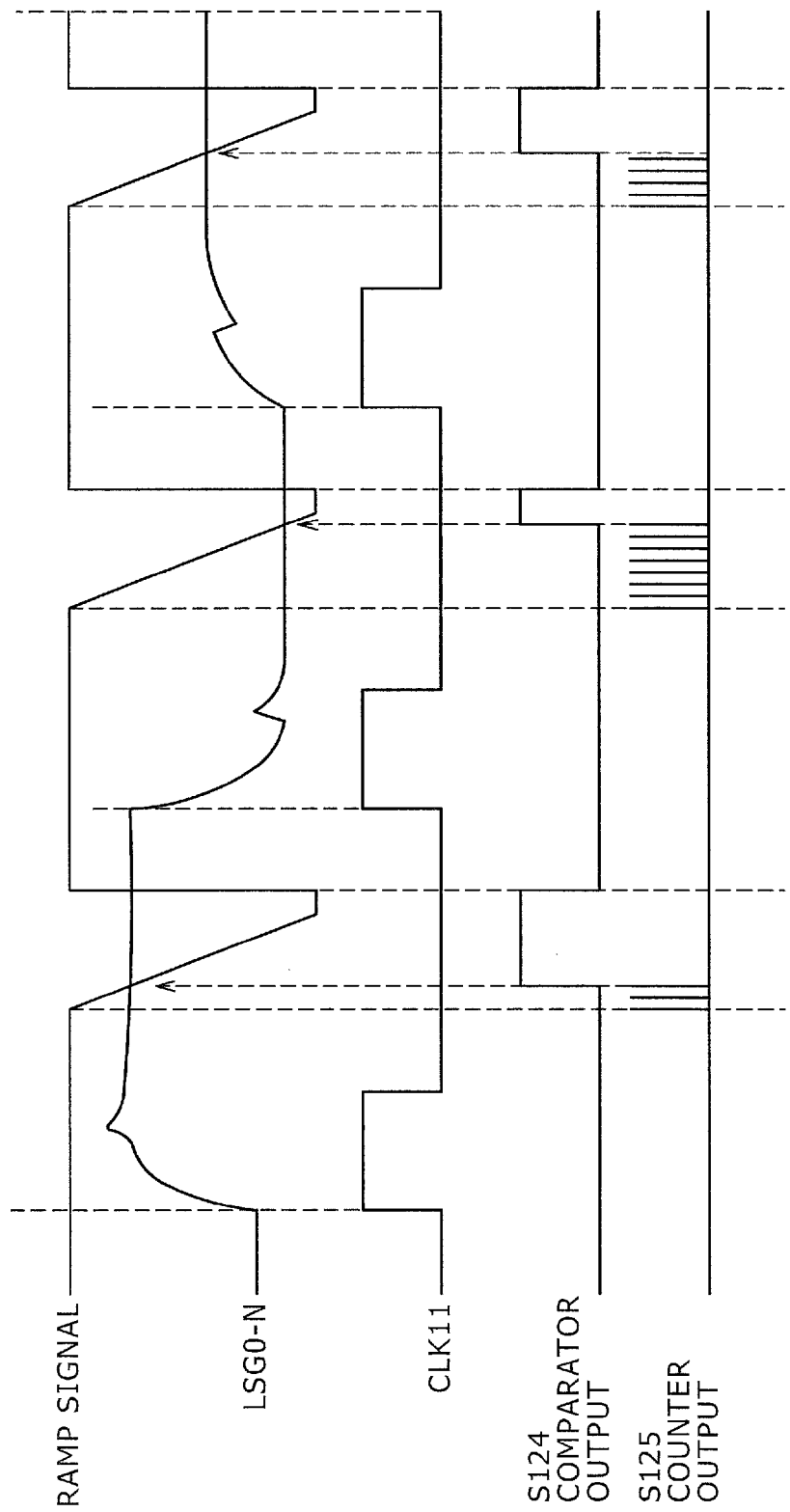
FIG. 14 is a diagram showing the operation of the semiconductor device of FIG. 13 by waveforms on a time axis, and shows that interference from adjacent columns can be reduced.

FIG. 14 shows that interference from adjacent columns can be reduced in this case on similar principles to those of FIG. 11. In the configuration of FIG. 13, AD conversion operation is performed by comparing the ramp signal RAMP with the signals, and converting times of the comparison into digital values by the counters 125. Thus, the AD converters do not take in the signals during the times during which the ramp wave and the counters 125 are not operating.

In this case, as shown in FIG. 14, an error caused by interference from an adjacent TCV can be reduced as in FIG. 11 by starting the transition of the ramp wave and the operation of the counters after signal output LSGO-N becomes statically determinate sufficiently.

<2. Outlines of Solid-State Imaging Device>

An example of configuration of a CMOS image sensor as a solid-state imaging device will be described as an example of the semiconductor device according to the present embodiment.

<2.1 Basic Example of Configuration of Solid-State Imaging Device>

Figure 15:
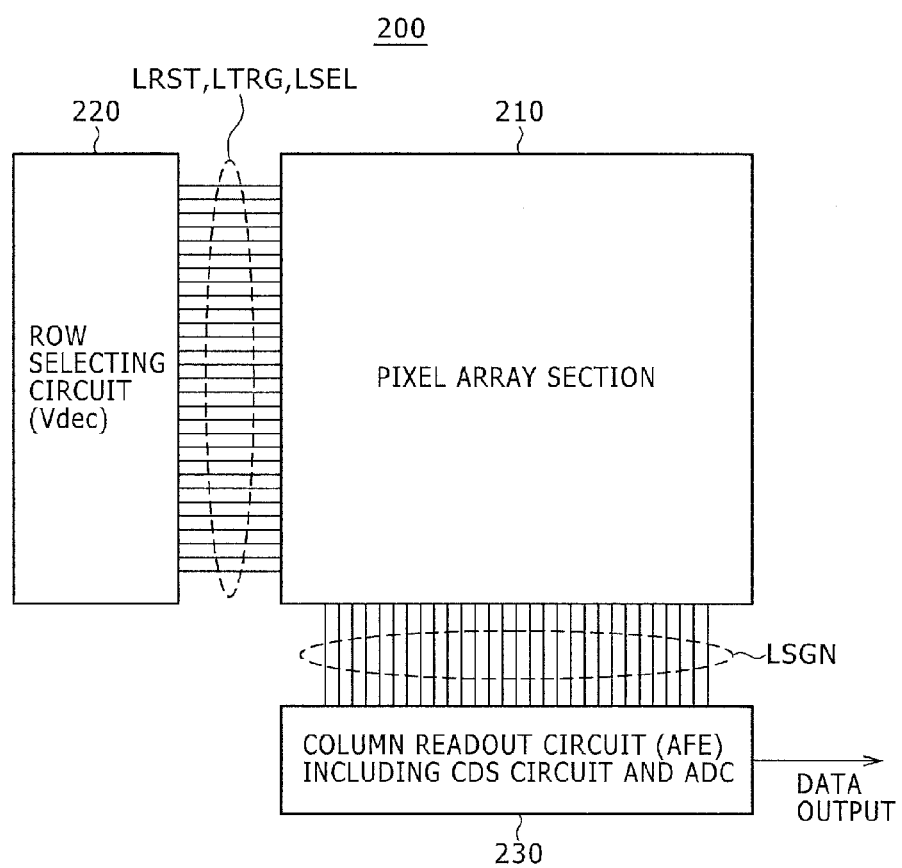
FIG. 15 is a diagram showing a basic example of configuration of a CMOS image sensor (solid-state imaging device) according to the present embodiment.

FIG. 15 is a diagram showing a basic example of configuration of a CMOS image sensor (solid-state imaging device) according to the present embodiment.

The CMOS image sensor 200 in FIG. 15 has a pixel array section 210, a row selecting circuit (Vdec) 220, and a column readout circuit (AFE) 230.

The row selecting circuit 220 and the column readout circuit 230 form a pixel signal readout section.

The CMOS image sensor 200 as the semiconductor device has the laminated structure of FIG. 9.

In the present embodiment, the laminated structure basically has the pixel array section 210 disposed in the first chip 110, and has the row selecting circuit 220 and the column readout circuit 230, which form the pixel signal readout section, disposed in the second chip 120.

Pixel driving signals, analog readout signals from pixels (sensors), power supply voltage, and the like are transmitted and received between the first chip 110 and the second chip 120 via TCVs formed in the first chip 110.

The pixel array section 210 has a plurality of pixel circuits 210A arranged two-dimensionally (in the form of a matrix) with M rows and N columns.

Figure 16:
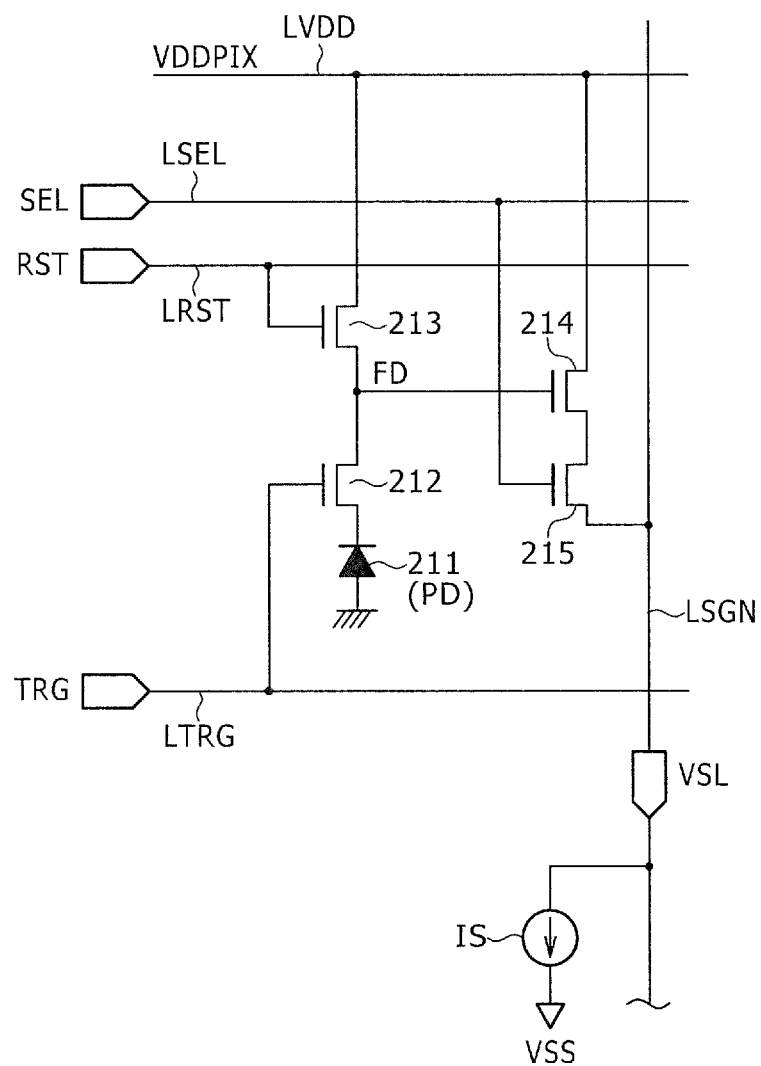
FIG. 16 is a diagram showing an example of a pixel in the CMOS image sensor which pixel is formed with four transistors according to the present embodiment.

FIG. 16 is a diagram showing an example of a pixel in the CMOS image sensor which pixel is formed with four transistors according to the present embodiment.

The pixel circuit 210A has a photoelectric conversion element 211 formed by a photodiode (PD) (which photoelectric conversion element may hereinafter be referred to simply as a PD), for example.

The pixel circuit 210A has four transistors, which are a transfer transistor 212, a reset transistor 213, an amplifying transistor 214, and a selecting transistor 215, as active elements for the one photoelectric conversion element 211.

The photoelectric conversion element 211 performs photoelectric conversion of incident light into an amount of charge (electrons in this case) which amount corresponds to the amount of the incident light.

The transfer transistor 212 as a transfer element is connected between the photoelectric conversion element 211 and a floating diffusion FD as an input node. The gate (transfer gate) of the transfer transistor 212 is supplied with a transfer signal TRG as a control signal via a transfer control line LTRG.

The transfer transistor 212 thereby transfers the electrons obtained by the photoelectric conversion in the photoelectric conversion element 211 to the floating diffusion FD.

The reset transistor 213 is connected between a power supply line LVDD supplied with a power supply voltage VDD and the floating diffusion FD. The gate of the reset transistor 213 is supplied with a reset signal RST as a control signal via a reset control line LRST.

The reset transistor 213 as a reset element thereby resets the potential of the floating diffusion FD to the potential of the power supply line LVDD.

The floating diffusion FD is connected with the gate of the amplifying transistor 214 as an amplifying element. That is, the floating diffusion FD functions as the input node of the amplifying transistor 214 as an amplifying element.

The amplifying transistor 214 and the selecting transistor 215 are connected in series with each other between the power supply line LVDD supplied with the power supply voltage VDD and a signal line LSGN.

Thus, the amplifying transistor 214 is connected to the signal line LSGN via the selecting transistor 215, and forms a source follower with a constant-current source IS outside the pixel section.

A selecting signal SEL as a control signal according to an address signal is supplied to the gate of the selecting transistor 215 via a selection control line LSEL, so that the selecting transistor 215 is turned on.

When the selecting transistor 215 is turned on, the amplifying transistor 214 amplifies the potential of the floating diffusion FD, and outputs a voltage corresponding to the potential to the signal line LSGN. The voltage output from each pixel via the signal line LSGN is output to the column readout circuit 230.

These operations are performed simultaneously for pixels of one row because the respective gates of the transfer transistor 212, the reset transistor 213, and the selecting transistor 215 are connected in a row unit, for example.

The reset control line LRST, the transfer control line LTRG, and the selection control line LSEL arranged in the pixel array section 210 are arranged as one set in each row unit of the pixel arrangement.

M control lines LRST, M control lines LTRG, and M control lines LSEL are provided.

The reset control lines LRST, the transfer control lines LTRG, and the selection control lines LSEL are driven by the row selecting circuit 220.

The pixel array section 210 having such a configuration, including signal wiring and control wiring, is formed in the first chip 110, as described above.

In the present embodiment, the constant-current source IS forming the source follower with the amplifying transistor 214 disposed in the first chip 110 is disposed on the side of the second chip 120.

The row selecting circuit 220 controls the operation of pixels arranged in an arbitrary row in the pixel array section 210. The row selecting circuit 220 controls the pixels via the control lines LSEL, LRST, and LTRG.

The row selecting circuit 220 switches an exposure system to a rolling shutter system in which exposure is performed on a row-by-row basis or a global shutter system in which exposure is performed in all pixels simultaneously according to a shutter mode switching signal, for example, and performs image driving control.

The column readout circuit 230 receives the data of the pixel row whose readout is controlled by the row selecting circuit 220 via signal output lines LSGN, and transfers the data to a signal processing circuit in a subsequent stage.

The column readout circuit 230 includes a CDS circuit and an ADC (Analog-to-Digital Converter).

<2.2 Example of Configuration of Solid-State Imaging Device Including Column-Parallel ADCs>

Incidentally, the CMOS image sensor according to the present embodiment, though not particularly limited, can be configured as a CMOS image sensor including column-parallel type analog-to-digital converting devices (hereinafter abbreviated to ADCs), for example.

Figure 17:
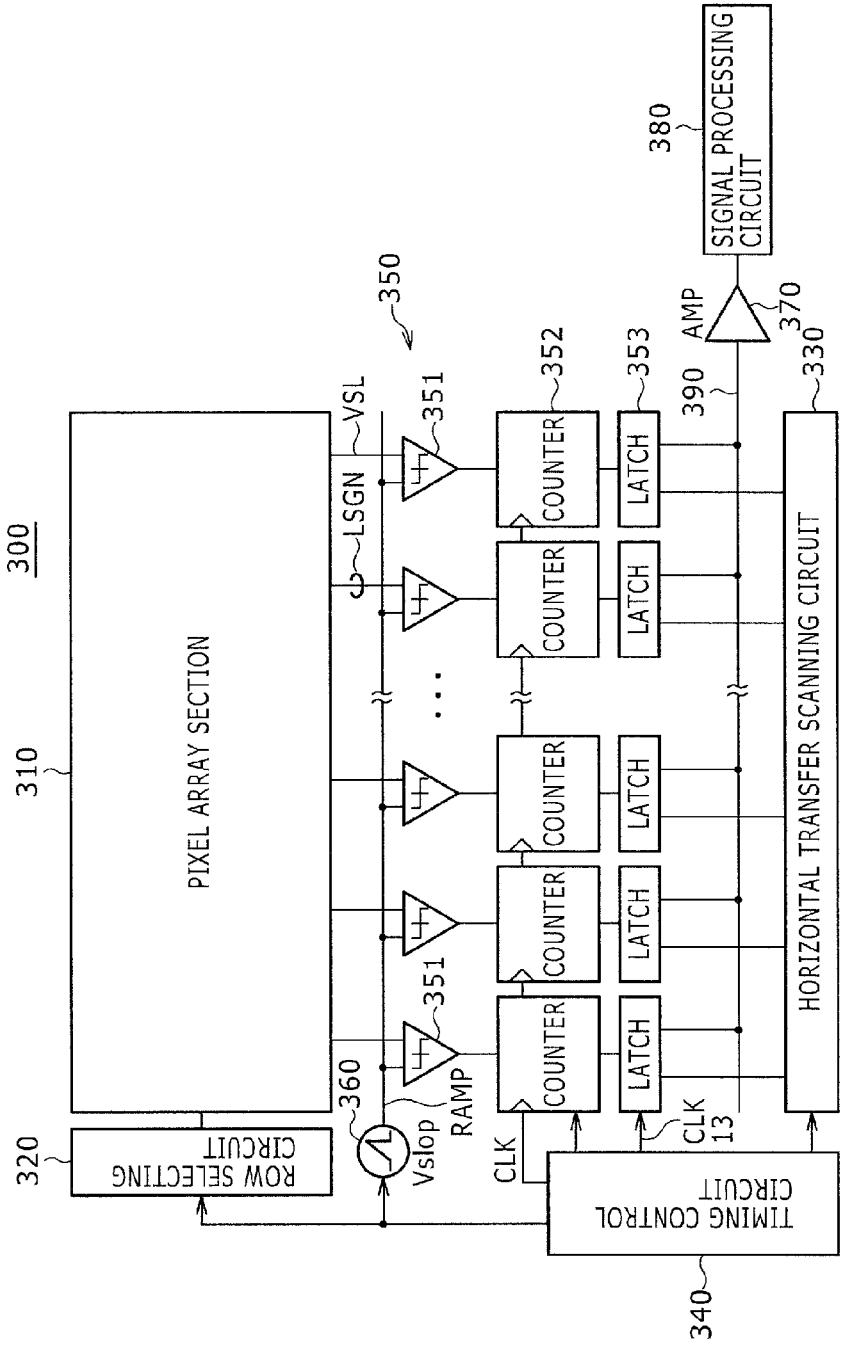
FIG. 17 is a block diagram showing an example of configuration of a CMOS image sensor (solid-state imaging device) including column-parallel ADCs according to the present embodiment.

FIG. 17 is a block diagram showing an example of configuration of a CMOS image sensor (solid-state imaging device) including column-parallel type ADCs according to the present embodiment.

As shown in FIG. 17, the solid-state imaging element 300 includes a pixel array section 310 as an imaging section, a row selecting circuit 320 as a pixel driving section, a horizontal transfer scanning circuit 330, and a timing control circuit 340.

The solid-state imaging element 300 further includes an ADC group 350, a digital-to-analog converting device (hereinafter abbreviated as a DAC (digital-to-analog converter)) 360 as a ramp signal generator, amplifier circuits (S/A) 370, a signal processing circuit 380, and a horizontal transfer line 390.

The pixel array section 310 is formed by arranging pixels as shown in FIG. 16, for example, in the form of a matrix, the pixels each including a photoelectric conversion element (photodiode) and an amplifier within the pixel.

The solid-state imaging element 300 also has the following circuits arranged therein as a control circuit for sequentially reading out signals of the pixel array section 310.

The timing control circuit 340 for generating an internal clock as a control circuit, the row selecting circuit 320 for controlling row addresses and row scanning, and the horizontal transfer scanning circuit 330 for controlling column addresses and column scanning are arranged in the solid-state imaging element 300.

The ADC group 350 has a single slope type ADC arranged in a plurality of columns, the single slope type ADCs each including a comparator 351, a counter 352, and a latch 353.

The comparator 351 compares a reference voltage Vslop, which is a ramp waveform (RAMP) obtained by changing a reference voltage generated by the DAC 360 stepwise, with an analog signal obtained from a pixel in each row line via a vertical signal line LSGN.

The counter 352 counts the comparison time of the comparator 351.

The ADC group 350 has an n-bit digital signal converting function. The ADC group 350 is arranged for each vertical signal line (column line), and forms a column-parallel ADC block.

The output of each latch 353 is connected to the horizontal transfer line 390 having a 2n-bit width, for example.

Then, 2n amplifier circuits 370 corresponding to the horizontal transfer line 390 and the signal processing circuit 380 are arranged.

In the ADC group 350, the comparator 351 arranged in each column compares an analog signal (potential VSL) read out to the vertical signal line LSGN with the reference voltage Vslop (slope waveform having a certain slope and changing linearly).

At this time, the counter 352 arranged in each column in a similar manner to the comparator 351 is operating, and the certain potential Vslop of the ramp waveform RAMP and a counter value change while having a one-to-one correspondence with each other, whereby the potential (analog signal) VSL of the vertical signal line is converted into a digital signal.

A change in the reference voltage Vslop converts a change in voltage to a change in time. The time is counted in certain cycles (clock), and thereby converted into a digital value.

Then, when the analog electric signal VSL and the reference voltage Vslop intersect each other, the output of the comparator 351 is inverted to stop the input clock of the counter 352, and AD conversion is completed.

After an end of a period of the AD conversion described above, the horizontal transfer scanning circuit 330 inputs the data retained by the latch 353 to the signal processing circuit 380 via the horizontal transfer line 390 and the amplifier circuits 370, and a two-dimensional image is generated.

Column-parallel output processing is thus performed.

Incidentally, a concrete configuration of the comparator 351 adopted in this case will be described later in detail.

The CMOS image sensor 300 as a semiconductor device also has the laminated structure of FIG. 9.

In the present embodiment, the laminated structure basically has the pixel array section 310 disposed in the first chip 110.

Arranged in the second chip 120 are the row selecting circuit 320, the horizontal transfer scanning circuit 330, the timing control circuit 340, the ADC group 350, the DAC (ramp signal generator) 360, the amplifier circuits (S/A) 370, the signal processing circuit 380, and the horizontal transfer line 390.

Pixel driving signals, analog readout signals from pixels (sensors), power supply voltage, and the like are transmitted and received between the first chip 110 and the second chip 120 via TCVs formed in the first chip 110.

<2.3 First Example of Arrangement and Configuration in Solid-State Imaging Device>

The following description will be made of an example of configuration in which the constituent elements of the CMOS image sensor including the column-parallel ADCs in FIG. 17 are arranged in the first chip and the second chip of the laminated structure.

Figure 18:
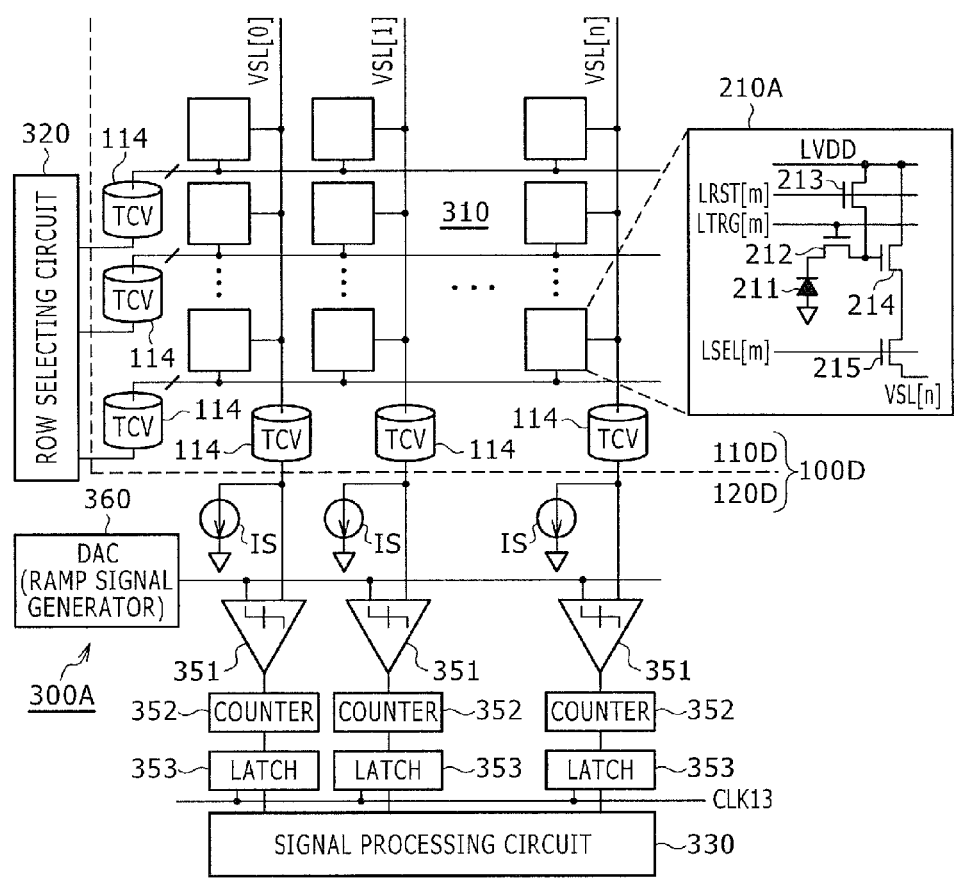
FIG. 18 is a diagram showing a first example of arrangement and configuration of circuits and the like in the CMOS image sensor including the column-parallel ADCs according to the present embodiment.

FIG. 18 is a diagram showing a first example of arrangement and configuration of circuits and the like in the CMOS image sensor including the column-parallel ADCs according to the present embodiment.

Also in FIG. 18, the first chip 110D and the second chip 120D are shown developed two-dimensionally in order to facilitate understanding of the arrangement of the circuits and the like of the first chip 110D and the second chip 120D having the laminated structure.

The timing control circuit 340, the amplifier circuits 370, and the signal processing circuit 380 are omitted in FIG. 18. These circuits are arranged in the second chip 120D.

As described above, the laminated structure basically has the pixel array section 310 arranged in the first chip 110D.

Arranged in the second chip 120D are the row selecting circuit 320, the horizontal transfer scanning circuit 330, the timing control circuit 340, the comparators 351, the counters 352, and the latches 353 of the ADC group 350, and the DAC (ramp signal generator) 360.

Pixel driving signals, analog readout signals from pixels (sensors), power supply voltage, and the like are transmitted and received between the first chip 110D and the second chip 120D via TCVs formed in the first chip 110D.

Incidentally, in the present embodiment, a current source IS forming a source follower with the amplifying transistor of a pixel or the like disposed in the first chip 110D is disposed in the second chip 120D.

The example of arrangement and configuration of FIG. 18 is similar to the example of arrangement and configuration of FIG. 13.

A transfer control signal TRG for performing on-off control of a transfer transistor (transfer switch), the transfer control signal TRG being output from the row selecting circuit 320, in the CMOS image sensor 300A of FIG. 18 has a function equivalent to that of the first clock CLK11 in FIG. 13.

For this, the timing of generation of a ramp wave is controlled so as to provide a time for VSL[m] to become statically determinate sufficiently, whereby signals can be transmitted while an error caused by interference from an adjacent TCV is suppressed as shown in FIG. 14.

Figure 19:
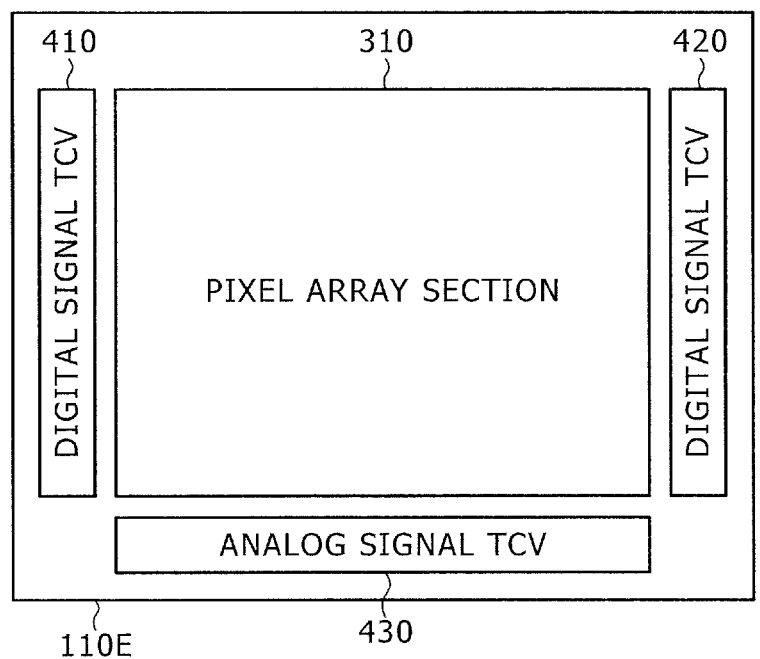
FIG. 19 is a diagram showing an example in which TCVs for transmitting discrete time analog signals are arranged in a concentrated manner and are arranged so as to be separated from TCVs for transmitting digital signals.

FIG. 19 is a diagram showing an example in which TCVs for transmitting discrete time analog signals are arranged in a concentrated manner and are arranged so as to be separated from TCVs for transmitting digital signals.

A configuration as described above can suppress interference from an adjacent TCV.

However, in the system of FIG. 18, for example, the output of the row selecting circuit 320 is ordinary digital signals for turning on and off switches, and it is not easy to reduce interference from these signals to the signal line LSGN[n].

Thus, as shown in FIG. 19, it is effective in the present technology to arrange TCVs for transmitting discrete time analog signals in a concentrated manner and arrange the TCVs for transmitting the discrete time analog signals in such a manner as to be separated from TCVs for transmitting digital signals.

In the example of FIG. 19, regions 410 and 420 for arranging TCVs for digital signals are formed in both of a left side part and a right side part in FIG. 19 of a pixel array section 310 in a first chip 110E.

A region 430 for arranging TCVs for analog signals is formed in a lower side part in FIG. 19 of the pixel array section 310.

<2.4 Second Example of Arrangement and Configuration in Solid-State Imaging Device>

Figure 20:
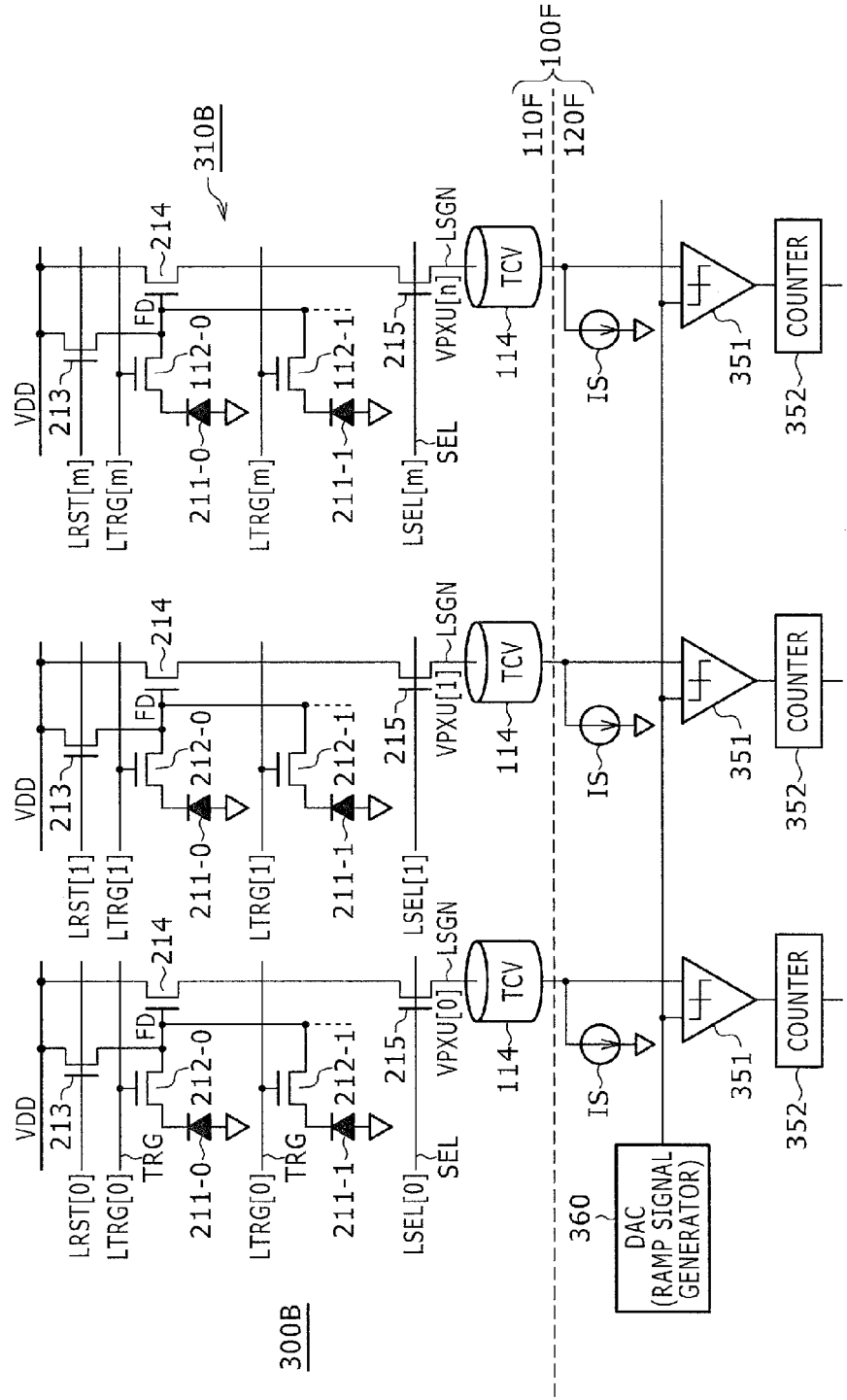
FIG. 20 is a diagram showing a second example of arrangement and configuration of circuits and the like in a CMOS image sensor including column-parallel ADCs according to the present embodiment.

FIG. 20 is a diagram showing a second example of arrangement and configuration of circuits and the like in a CMOS image sensor including column-parallel ADCs according to the present embodiment.

The CMOS image sensor 300B in FIG. 20 is an example in which a plurality of pixels share one floating diffusion FD in a pixel array section 310B.

In the example of FIG. 20, two pixels share a floating diffusion FD, a reset transistor 213, an amplifying transistor 214, and a selecting transistor 215.

Each of the pixels includes a photoelectric conversion element (photodiode) 211 and a transfer transistor 212.

Also in this case, basically, the pixel array section 310B is disposed in a first chip 110F, and the other configuration is similar to that of FIG. 18.

<2.5 Third Example of Arrangement and Configuration in Solid-State Imaging Device>

Figure 21:
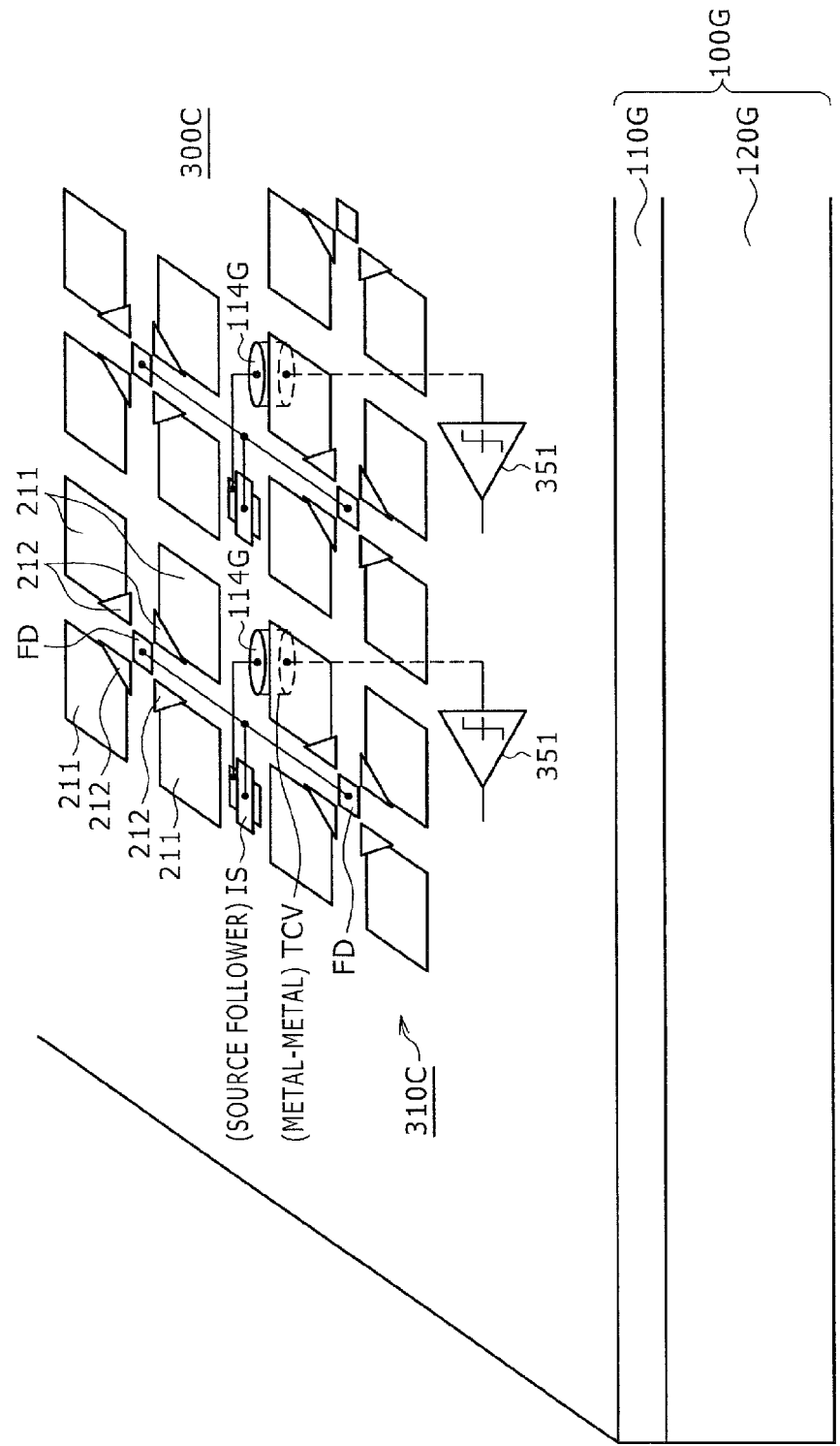
FIG. 21 is a diagram showing a third example of arrangement and configuration of circuits and the like in a CMOS image sensor including column-parallel ADCs according to the present embodiment.

FIG. 21 is a diagram showing a third example of arrangement and configuration of circuits and the like in a CMOS image sensor including column-parallel ADCs according to the present embodiment.

As with FIG. 20, the CMOS image sensor 300C in FIG. 21 is an example in which a plurality of pixels share one floating diffusion FD in a pixel array section 310C.

Also in this case, basically, the pixel array section 310C is disposed in a first chip 110G.

In this example, TCVs 114G are formed in the vicinity of sharing regions.

A TCV 114G is formed by connecting metallic (for example Cu) connecting electrodes formed in the first chip 110G and a second chip 120G to each other by metal. A pixel signal output to a vertical signal line LSGN is supplied to a comparator 351 on the side of the second chip 120G via the TCV 114G.

<3. Example of Configuration of Comparator>

Description will next be made of a concrete example of configuration of the comparator 351 applied to an ADC group and forming a column ADC.

When the embodiment of the present technology as described above is carried out, there is a fear that the noise of the quantizers or the comparators, which circuits are implemented on the second chip as a digital chip, may be increased as compared with a case where these circuits are implemented on an analog chip.

Examples of configuration of comparators effective against this noise in the CMOS image sensors of FIGS. 17 to 21 will be shown in the following.

<3.1 Basic Example of Configuration of Comparator>

Figure 22:
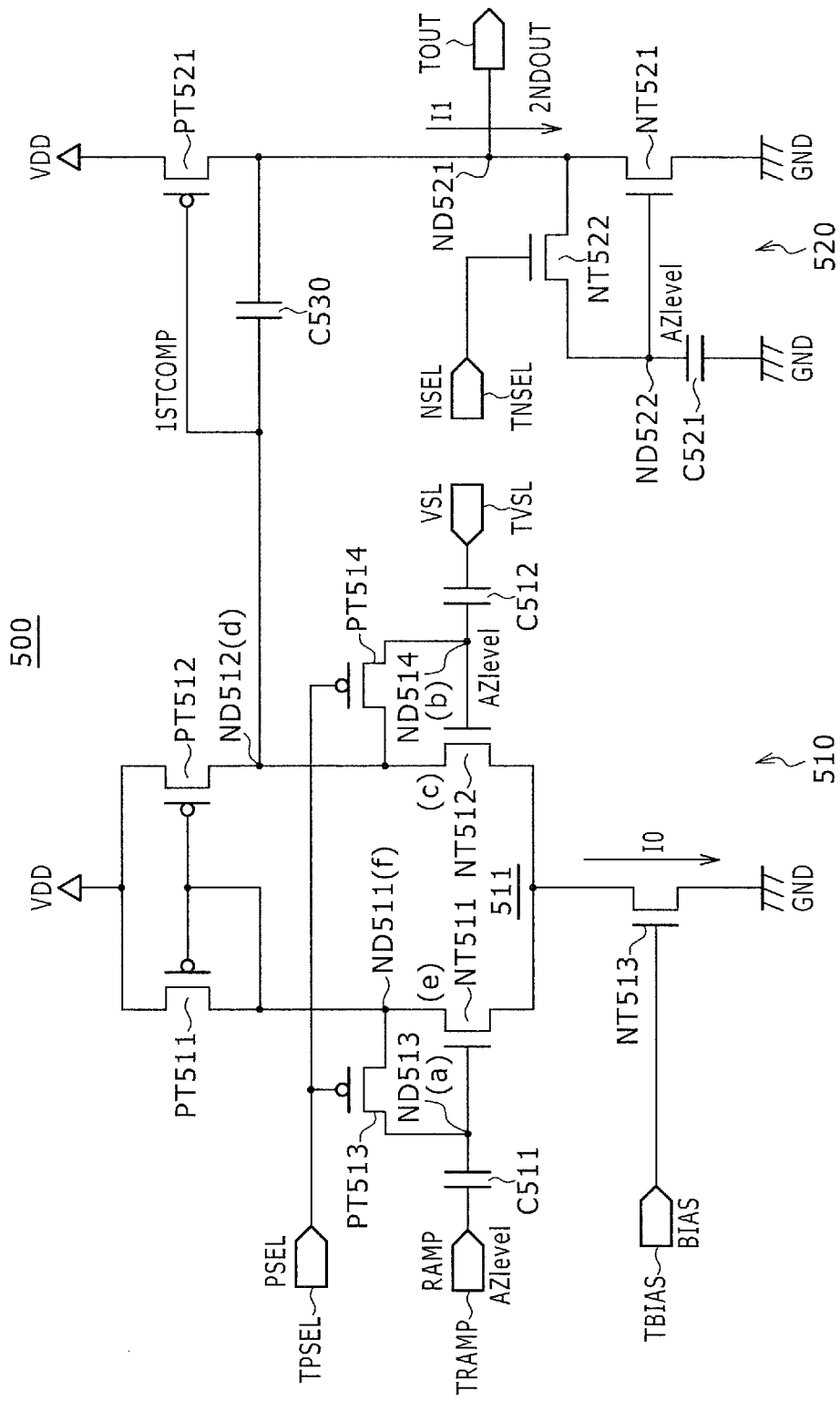
FIG. 22 is a circuit diagram showing a first example of configuration of a comparator according to the present embodiment.

FIG. 22 is a circuit diagram showing a first example of configuration of a comparator according to the present embodiment.

The comparator in the following is identified by a reference numeral 500.

FIG. 22 shows an example of configuration of the comparator that reduces noise by greatly limiting a band using a mirror capacitance. Thus configuring the comparator reduces noise power output by the comparator. Therefore the disadvantage of implementing the comparator on the second chip as a digital chip can be offset.

As shown in FIG. 22, the comparator 500 arranged in each column includes a first amplifier 510, a second amplifier 520, the first amplifier 510 and the second amplifier 520 being cascaded, and a capacitor C530 as a capacitance for achieving a mirror effect.

The capacitance is connected between the input and output of a common-source amplifier of the second amplifier 520 in the second stage. This capacitance exerts a mirror effect, and is equivalent to a capacitance multiplied by a gain being connected to the common source input.

The band of each comparator 500 is thereby narrowed greatly by a small capacitance.

Each comparator 500 has a function of performing initialization (auto-zero: AZ) and sampling to determine an operating point in each column at a time of a start of row operation.

Incidentally, in the present embodiment, a first conductivity type is a p-channel or an n-channel, and a second conductivity type is an n-channel or a p-channel.

The first amplifier 510 includes p-channel MOS (PMOS) transistors PT511 to PT514 and n-channel MOS (NMOS) transistors NT511 to NT513 as insulated gate field effect transistors.

The first amplifier 510 includes a first and a second capacitor C511 and C512 as AZ level sampling capacitances (input capacitances).

The source of the PMOS transistor PT511 and the source of the PMOS transistor PT512 are connected to a power supply potential source VDD.

The drain of the PMOS transistor PT511 is connected to the drain of the NMOS transistor NT511. A point of connection between the drain of the PMOS transistor PT511 and the drain of the NMOS transistor NT511 forms a node ND511. In addition, the drain and the gate of the PMOS transistor PT511 are connected to each other. A point of connection between the drain and the gate of the PMOS transistor PT511 is connected to the gate of the PMOS transistor PT512.

The drain of the PMOS transistor PT512 is connected to the drain of the NMOS transistor NT512. A point of connection between the drain of the PMOS transistor PT512 and the drain of the NMOS transistor NT512 forms the output node ND512 of the first amplifier 510.

The sources of the NMOS transistor NT511 and the NMOS transistor NT512 are connected to each other. A point of connection between the sources of the NMOS transistor NT511 and the NMOS transistor NT512 is connected to the drain of the NMOS transistor NT513. The source of the NMOS transistor NT513 is connected to a reference potential source (for example a ground potential) GND.

The gate of the NMOS transistor NT511 is connected to the first electrode of the capacitor C511. A point of connection between the gate of the NMOS transistor NT511 and the first electrode of the capacitor C511 forms a node ND513. The second electrode of the capacitor C511 is connected to an input terminal TRAMP for inputting a ramp signal RAMP.

The gate of the NMOS transistor NT512 is connected to the first electrode of the capacitor C512. A point of connection between the gate of the NMOS transistor NT512 and the first electrode of the capacitor C512 forms a node ND514. The second electrode of the capacitor C512 is connected to an input terminal TVSL for inputting an analog signal VSL.

In addition, the gate of the NMOS transistor NT513 is connected to an input terminal TBIAS for inputting a bias signal BIAS.

The source of the PMOS transistor PT513 is connected to the node ND511. The drain of the PMOS transistor PT513 is connected to the node ND513. The source of the PMOS transistor PT514 is connected to the node ND512. The drain of the PMOS transistor PT514 is connected to the node ND514.

The gates of the PMOS transistors PT513 and PT514 are connected to a common input terminal TPSEL for inputting a first AZ signal PSEL, which is active at a low level.

The PMOS transistors PT511 and PT512 in the first amplifier 510 having such a configuration form a current mirror circuit.

The NMOS transistors NT511 and NT512 form a differential comparator section (transconductance amplifier (Gm amplifier)) 511 having the NMOS transistor NT513 as a current source.

In addition, the PMOS transistors PT513 and PT514 function as an AZ (auto-zero: initialization) switch. The capacitors C511 and C512 function as an AZ level sampling capacitance.

An output signal 1stcomp of the first amplifier 510 is output from the output node ND512 to the second amplifier 520.

The second amplifier 520 includes a PMOS transistor PT521, NMOS transistors NT521 and NT522, and a third capacitor C521 as an AZ level sampling capacitance.

The source of the PMOS transistor PT521 is connected to the power supply potential source VDD. The gate of the PMOS transistor PT521 is connected to the output node ND512 of the first amplifier 510.

The drain of the PMOS transistor PT521 is connected to the drain of the NMOS transistor NT521. A point of connection between the drain of the PMOS transistor PT521 and the drain of the NMOS transistor NT521 forms an output node ND521.

The source of the NMOS transistor NT521 is connected to the ground potential GND. The gate of the NMOS transistor NT521 is connected to the first electrode of the capacitor C521. A point of connection between the gate of the NMOS transistor NT521 and the first electrode of the capacitor C521 forms a node ND522. The second electrode of the capacitor C521 is connected to the ground potential GND.

The drain of the NMOS transistor NT522 is connected to the node ND521. The source of the NMOS transistor NT522 is connected to the node ND522.

The gate of the NMOS transistor NT522 is connected to an input terminal TNSEL for inputting a second AZ signal NSEL, which is active at a high level.

The second AZ signal NSEL assumes a level complementary to that of the first AZ signal PSEL supplied to the first amplifier 510.

In the second amplifier 520 having such a configuration, the PMOS transistor PT521 forms an input and amplifying circuit.

The NMOS transistor NT522 functions as an AZ switch. The capacitor C521 functions as an AZ level sampling capacitance.

The output node ND521 of the second amplifier 520 is connected to the output terminal TOUT of the comparator 500.

The capacitor C530 has a first electrode connected to the gate (input) of the PMOS transistor PT521 as a common-source amplifier, and has a second electrode connected to the drain (output) of the PMOS transistor PT521.

This capacitor C530 exerts a mirror effect, and is equivalent to a capacitance multiplied by a gain being connected to the common source input.

Letting $A_{v2}$ be the gain of the PMOS transistor PT521, and letting C be the capacitance of the capacitor C530, the capacitance as viewed from the output of the first amplifier 510 is multiplied by the gain, as expressed by $\{C*(1+A_{v2})\}$. A small capacitance value therefore suffices for the capacitor C530.

The band of the comparator 500 is thereby narrowed greatly by a small capacitance.

The method of inserting the mirror capacitance into the output of the first amplifier 510 in the first stage of the comparator 500 is basically a method of reducing the band of noise, that is, an operating band. Therefore, operating speed is decreased, and there is thus a small noise reducing effect at a certain level or higher.

Further, by reason of principles of noise reduction by the band limitation, this configuration has a small effect on low-frequency noise such as flicker noise, RTS noise, and the like.

The following description will be made of a configuration that can further reduce noise, or reduce low-frequency noise, in particular, in the comparator 500.

A comparator to be described in the following is characterized by the configuration of a first amplifier.

Incidentally, in the following description, constituent parts basically similar to those of FIG. 22 are identified by the same reference numerals in order to facilitate understanding.

<3.2 Basic Example of Configuration of Comparator Capable of Reducing Low-Frequency Noise>
[Basic Concept of Configuration]

Figure 23:
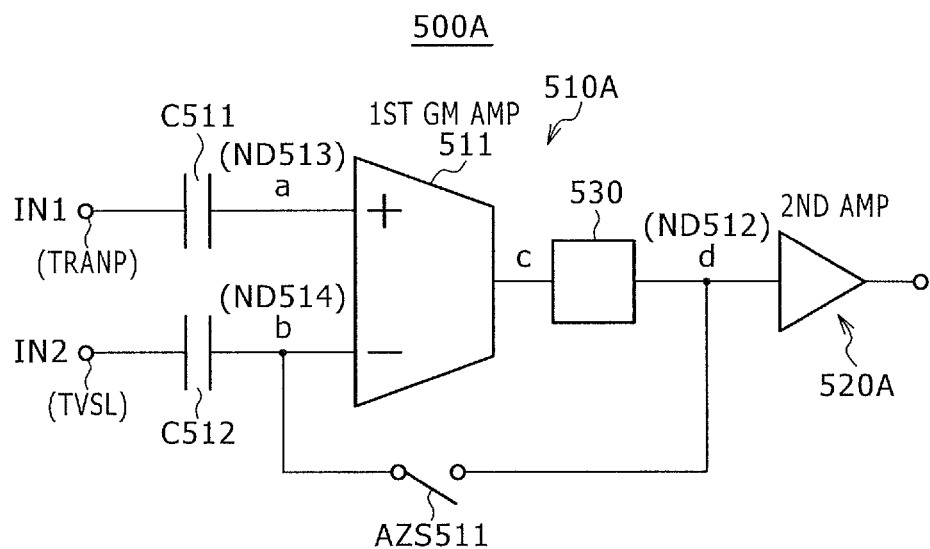
FIG. 23 is a diagram showing a basic concept of a comparator having an isolator which comparator can reduce low-frequency noise according to the present embodiment.

FIG. 23 is a diagram showing a basic concept of a comparator having an isolator which comparator can reduce low-frequency noise according to the present embodiment.

Figure 24:
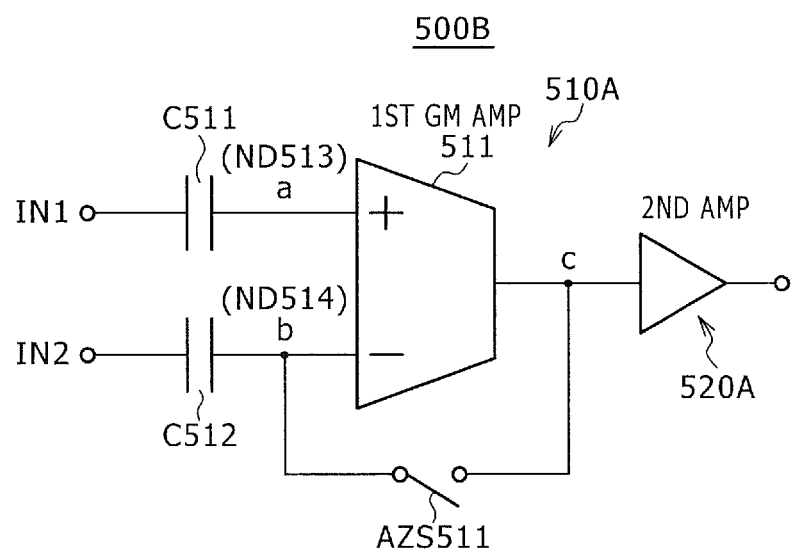
FIG. 24 is a diagram showing a basic concept of a comparator without an isolator as a comparative example for the comparator of FIG. 23.

FIG. 24 is a diagram showing a basic concept of a comparator without an isolator as a comparative example for the comparator of FIG. 23.

The comparator 500A according to the present embodiment includes auto-zero level sampling capacitances C511 and C512, an auto-zero switch AZS511, a first amplifier 510A including a transconductance (Gm) amplifier 511 in a first stage, and a second amplifier 520A subsequent to the first amplifier 510A.

Unlike the comparator 500B of FIG. 24 shown as a comparative example, the comparator 500A according to the present embodiment includes an isolator 530 for suppressing voltage variations, the isolator 530 being disposed at least on the output node side of the first amplifier 510A.

Incidentally, in FIG. 23 and FIG. 24, only the second amplifier in the second stage is shown in a stage subsequent to the first amplifier 510A. However, there may be any number of stages subsequent to the first amplifier 510A.

Description will be made supposing that one input side node ND513 of the first amplifier 510A is a node a, that the other input side node ND514 of the first amplifier 510A is a node b, that the output part of the Gm amplifier 511 in the first amplifier 510A is a node c, and that the output node ND512 of the first amplifier 510A is a node d.

The node c of the output part of the differential comparator section (Gm amplifier) 511 in the first amplifier 510A corresponds to the drain terminal side of the NMOS transistor NT512 in the first amplifier 510 in the comparator 500 of FIG. 22.

The isolator 530 isolates the voltage of the output node c of the Gm amplifier 511 in the first stage from the large-amplitude voltage node d, and holds the voltage of the output node c of the Gm amplifier 511 in the first stage as constant as possible.

The auto-zero switch AZS511 is connected between the node d on the output side of the isolator 530 and the high-impedance node b.

[Waveforms at Time of Input of Slope Signal]

Consideration will be given in the following of a case where a fixed input signal is input to one input (IN2) of the comparator and a slope signal is input to the other input (IN1) of the comparator. The slope signal in this case refers to a signal whose signal level decreases or increases with a certain slope as with a RAMP waveform.

Figure 25:
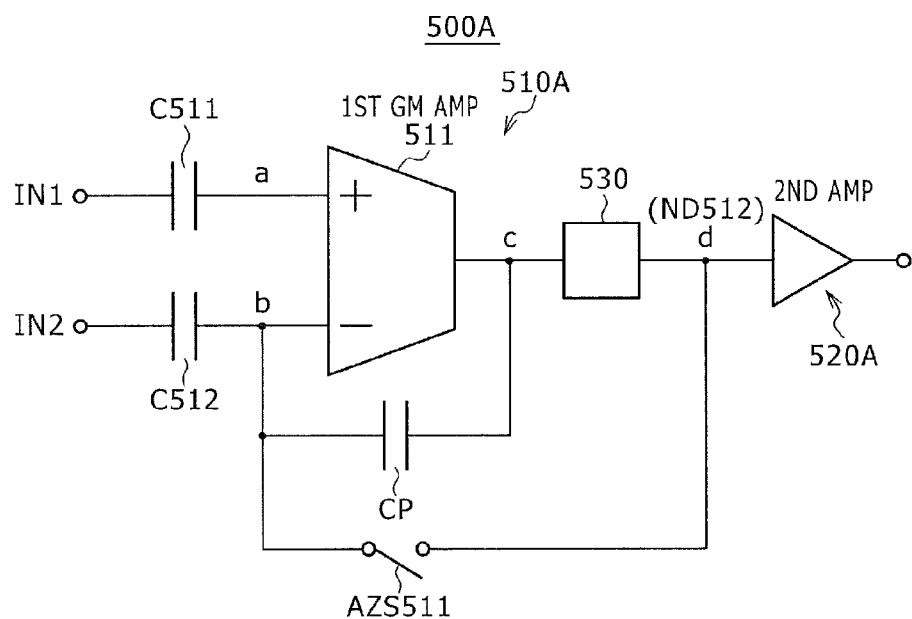
FIG. 25 is a diagram showing an example in which a parasitic capacitance is present between the input side node and the output side node of a Gm amplifier in the comparator according to the present embodiment in FIG. 23.

FIG. 25 is a diagram showing an example in which a parasitic capacitance is present between the input side node and the output side node of the Gm amplifier in the comparator according to the present embodiment in FIG. 23.

FIGS. 26A to 26D are diagrams showing the waveforms of respective nodes at a time of input of the slope signal in the case where the parasitic capacitance is present in the example of configuration of FIG. 25.

Figure 27:
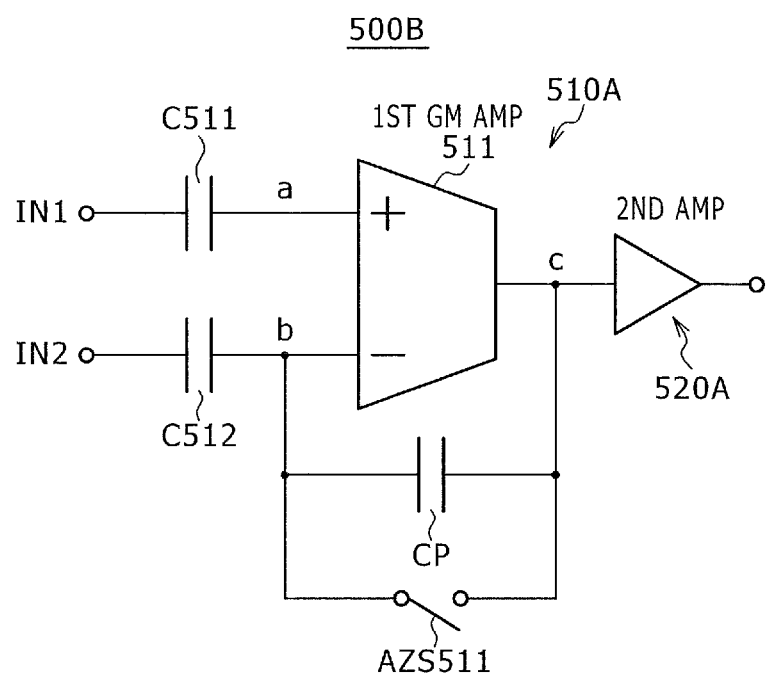
FIG. 27 is a diagram showing an example in which a parasitic capacitance is present between the input side node and the output side node of a Gm amplifier in the comparative example of FIG. 24.

FIG. 27 is a diagram showing an example in which a parasitic capacitance is present between the input side node and the output side node of the Gm amplifier in the comparative example of FIG. 24.

FIGS. 28A to 28D are diagrams showing the waveforms of respective nodes at a time of input of the slope signal in the case where the parasitic capacitance is present in the example of configuration of FIG. 27.

Figure 26A:
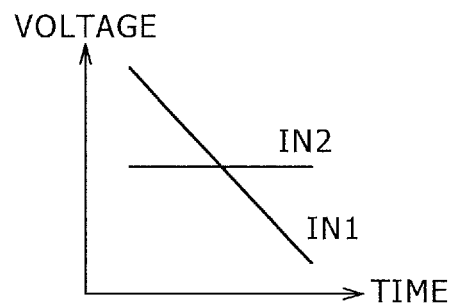
FIGS. 26A, 26B, 26C, and 26D are diagrams showing the waveforms of respective nodes at a time of input of a slope signal in the case where the parasitic capacitance is present in the example of configuration of FIG. 25.
Figure 26B:
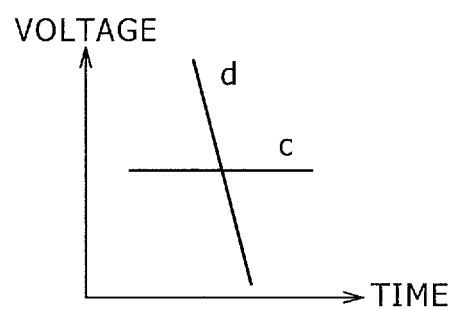

When a fixed input signal is input to one input (IN2) of the comparator 500A according to the present embodiment and a slope signal is input to the other input (IN1) of the comparator 500A, as shown in FIG. 26B, the node d has a slope waveform much steeper than the input slope signal.

However, the voltage of the output node c of the Gm amplifier 511 in the first stage is held constant by the isolator 530.

Figure 26C:
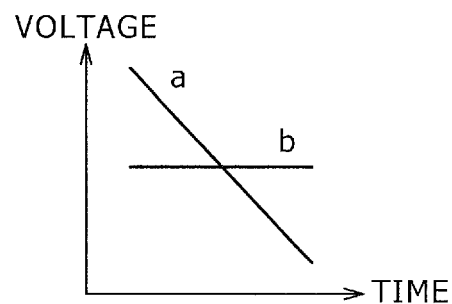

Thus, even when a parasitic capacitance Cp is present between the node b and the node c, the node b is maintained at a fixed voltage without being disturbed, as shown in FIG. 26C.

Figure 26D:
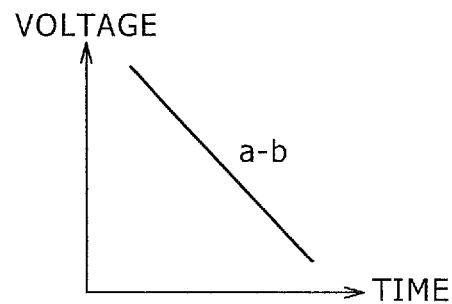

Hence, as shown in FIG. 26D, the input slope (IN1) is propagated as it is for the differential input signal (a−b) of the Gm amplifier 511 in the first stage in the comparator 500A.

Figure 28A:
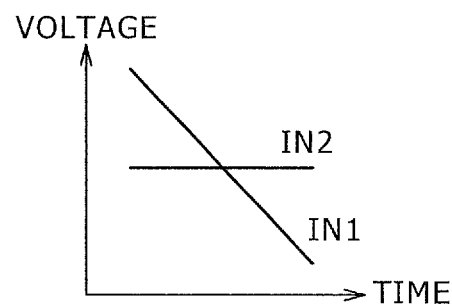
FIGS. 28A, 28B, 28C, and 28D are diagrams showing the waveforms of respective nodes at a time of input of a slope signal in the case where the parasitic capacitance is present in the example of configuration of FIG. 27.
Figure 28B:
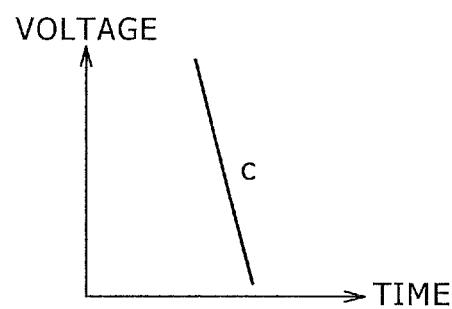
Figure 28C:
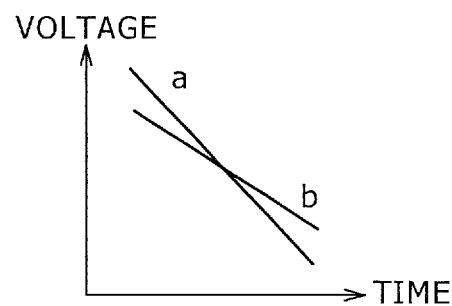

On the other hand, as shown in FIG. 28B, the node c has a very steep slope waveform in the configuration of the comparator 500B in the comparative example.

Figure 7:
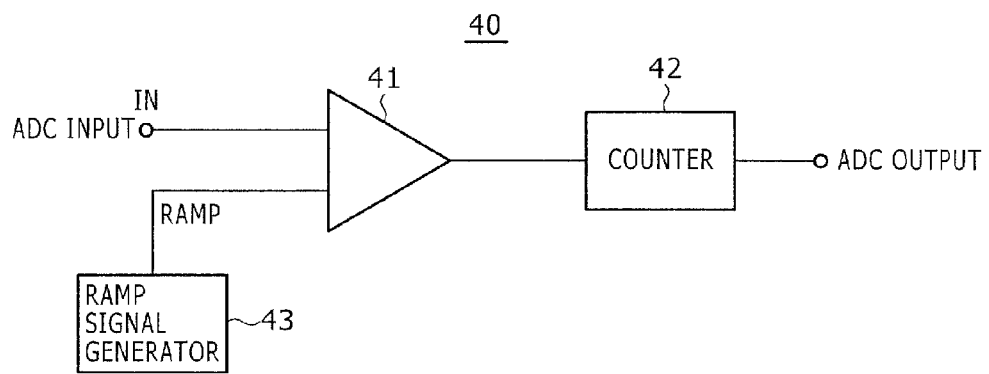
FIG. 7 is a diagram showing a configuration of an ordinary single slope type AD converter.
Figure 8:
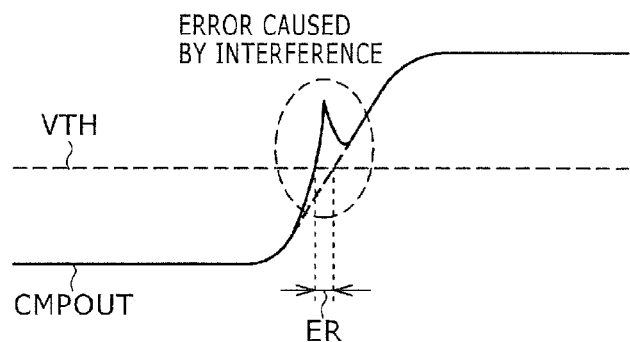
FIG. 8 is a diagram showing the effect of an error due to interference from an adjacent TCV.

Thus, the slope is injected into the node b through a parasitic capacitance Cp between the node b and the node c (FIG. 7).

Figure 28D:
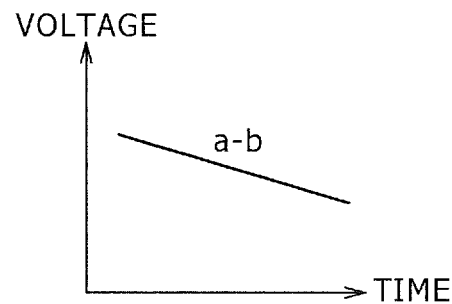

As a result, as shown in FIG. 28D, the slope of the differential input signal (a−b) of the Gm amplifier in the first stage in the comparator 500B is much less steep than the input slope (IN1).

[Noise Reduction]

Consideration will next be given to noise reduction.

Figure 29:
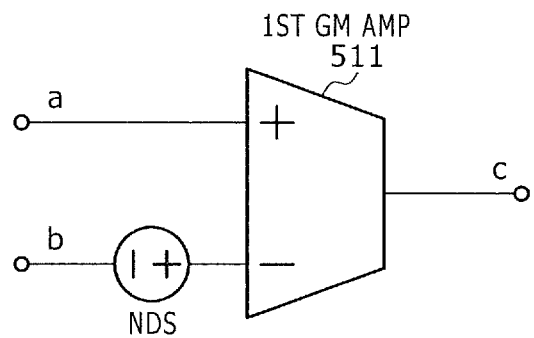
FIG. 29 is a diagram of assistance in explaining the noise source of the Gm amplifier in the first stage in the comparator.

FIG. 29 is a diagram of assistance in explaining the noise source of the Gm amplifier in the first stage in the comparator.

Figure 30A:
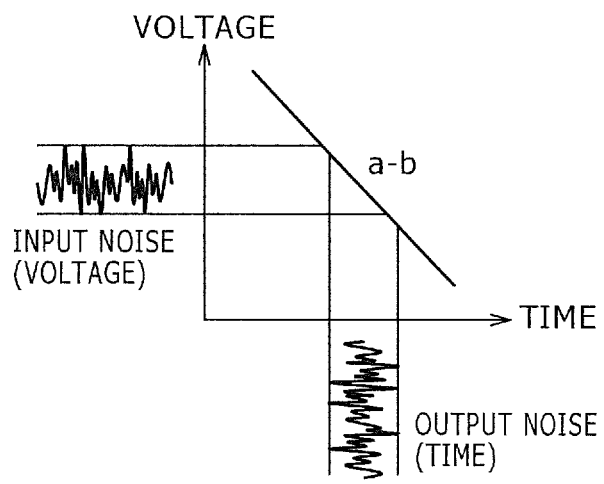
FIGS. 30A and 30B are diagrams showing examples of conversion of voltage noise to time noise.
Figure 30B:
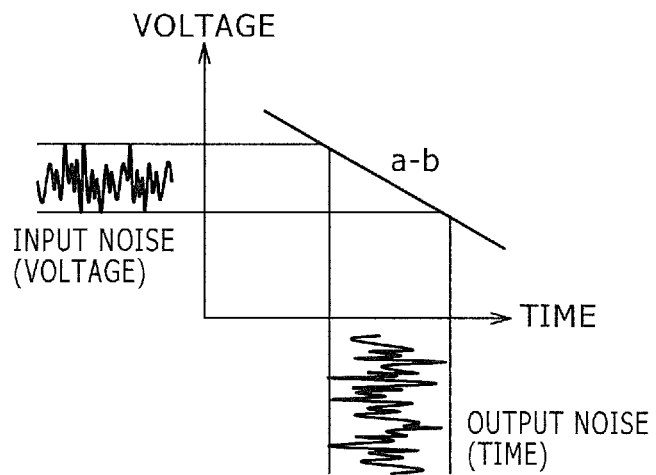

FIGS. 30A and 30B are diagrams showing examples of conversion of voltage noise to time noise.

The Gm amplifiers 511 in the first stages of the comparators 500A and 500B have a certain input-converted noise source. As shown in FIG. 29, this noise source can be described as an input-converted noise source NOS.

When a fixed input signal is input to one input (IN2) of the comparators 500A and 500B and a slope signal (waveform) is input to the other input (IN1) of the comparators 500A and 500B, the above-described voltage noise is converted as shown in FIGS. 30A and 30B.

Specifically, the voltage noise is converted into noise (so-called jitter) on a time axis with the slope gradient of the differential input signal (a−b) of the Gm amplifier 511 in the first stage as a conversion gain.

Thus, when the slope gradient of the differential input signal (a−b) is attenuated, the output noise of the comparators 500A and 500B increases.

As already described, as shown in FIG. 30A, the comparator 500A of the present configuration reduces the attenuation of the slope gradient. The output noise of the comparator 500A is consequently reduced.

Incidentally, when the slope gradient of the differential input signal (a−b) is increased, the operation of the Gm amplifier 511 in the first stage in the comparator 500A is increased in speed.

That is, the band of the comparator 500A is also raised. Therefore, the contribution of an increase in the slope gradient of the differential input signal (a−b) in relation to noise affecting even high frequencies such as thermal noise and the like is in less than direct proportion.

On the other hand, the contribution of an increase in the slope gradient of the differential input signal (a−b) in relation to low-frequency noise such as flicker noise, RTS noise, and the like is close to direct proportion. That is, the present technology is effective especially in reducing such low-frequency noise.

<3.3 Concrete Example of Circuit Configuration of Comparator Capable of Reducing Low-Frequency Noise>

[First Example of Circuit Configuration]

Figure 31:
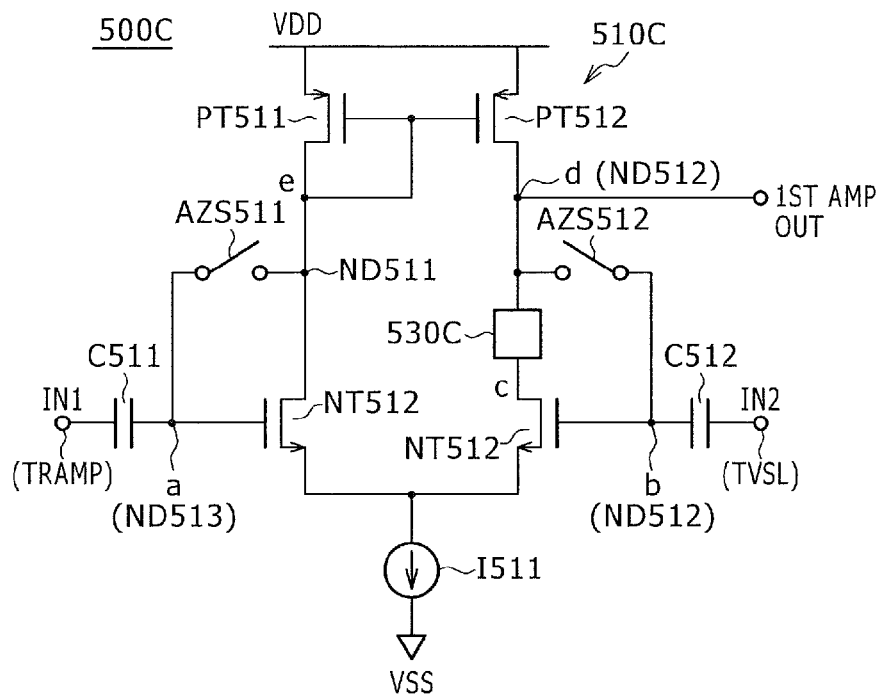
FIG. 31 is a diagram showing a first example of circuit configuration of a comparator capable of reducing low-frequency noise according to the present embodiment.

FIG. 31 is a diagram showing a first example of circuit configuration of a comparator capable of reducing low-frequency noise according to the present embodiment.

A comparator 500C in FIG. 31 is formed by disposing an isolator 530C between the output node ND512 and the drain terminal (output terminal) side of the NMOS transistor NT512 forming the NMOS differential pair (Gm amplifier) in the first amplifier 510 in the comparator 500 of FIG. 22.

Incidentally, in FIG. 31, the PMOS transistors PT513 and PT514 shown as auto-zero switches in FIG. 22 are shown as auto-zero switches AZS511 and AZS512, and the NMOS transistor NT513 is shown as a current source I511.

The parasitic capacitance Cp shown in FIG. 25 is formed mainly by the gate-to-drain capacitance Cgd of the NMOS transistor NT512 of the NMOS differential pair and a parasitic capacitance occurring between the respective pieces of metallic wiring of the gate and the drain of the NMOS transistor NT512 in the case of the comparator 500C of FIG. 31.
[Second Example of Circuit Configuration]

Figure 32:
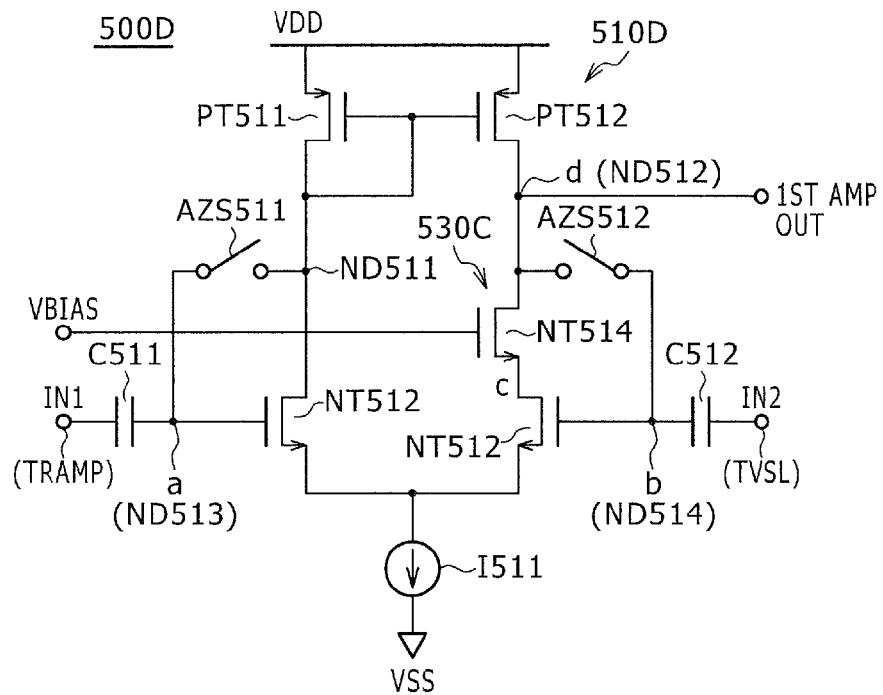
FIG. 32 is a diagram showing a second example of circuit configuration of a comparator capable of reducing low-frequency noise according to the present embodiment.

FIG. 32 is a diagram showing a second example of circuit configuration of a comparator capable of reducing low-frequency noise according to the present embodiment.

In the comparator 500D of FIG. 32, the isolator 530C in the comparator 500C of FIG. 31 is formed by an NMOS transistor NT514.

The drain of the NMOS transistor NT514 is connected to the output node ND512 (d) of a first amplifier 510D. The source of the NMOS transistor NT514 is connected to the drain (node c) of an NMOS transistor NT512 forming a Gm amplifier.

In the comparator 500D of FIG. 32, the gate of the NMOS transistor NT514 forming the isolator 530C is connected to a line for supplying a bias voltage VBIAS.

A fixed current thereby flows through the NMOS transistor NT514. Thus, even when there is a parasitic capacitance between the gate (input node b) and the drain (output node c) of the NMOS transistor NT512, voltage variations are suppressed, and low-frequency noise is reduced.

Incidentally, the transistor used for isolation is not limited to the same type as that of the transistors of the differential pair.
[Third Example of Circuit Configuration]

Figure 33:
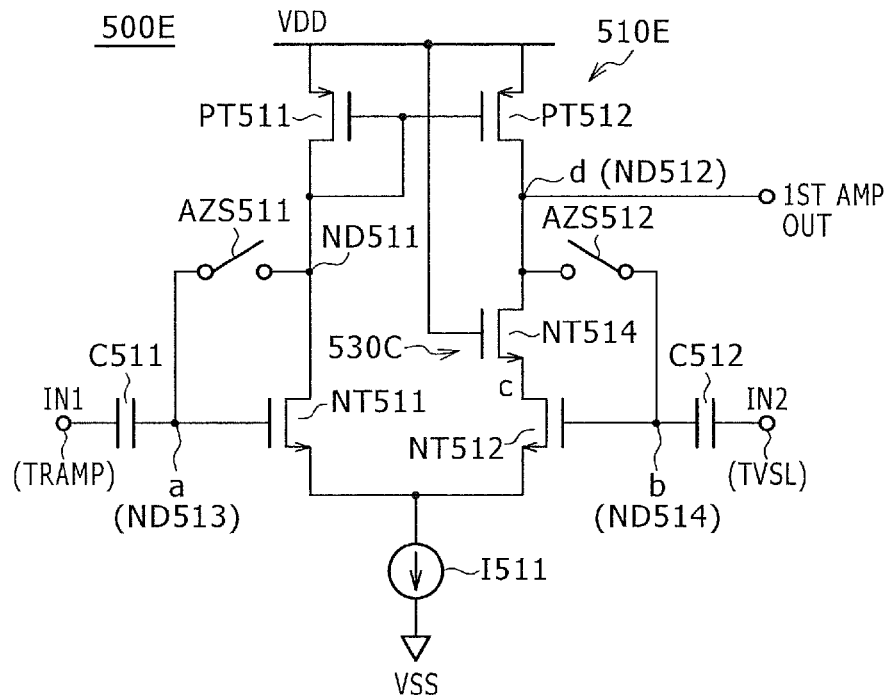
FIG. 33 is a diagram showing a third example of circuit configuration of a comparator capable of reducing low-frequency noise according to the present embodiment.

FIG. 33 is a diagram showing a third example of circuit configuration of a comparator capable of reducing low-frequency noise according to the present embodiment.

The comparator 500E of FIG. 33 is different from the comparator 500D of FIG. 32 in that the gate of an NMOS transistor NT514 of an isolator 530C in the comparator 500E is connected to a power supply voltage source VDD in place of the line for supplying the bias voltage VBIAS.

The comparator 500D of FIG. 32 needs the other bias voltage VBIAS to operate the NMOS transistor NT514.

When the comparator 500D is used in a column-parallel single slope AD converter in a CMOS image sensor or the like, for example, the following fears and the like arise from the necessity of the bias voltage VBIAS:

(1) interference between columns, (2) an increase in VBIAS wiring area, and (3) the necessity of a VBIAS generating circuit.

On the other hand, the comparator 500E of FIG. 33, in which the gate of the NMOS transistor NT514 is connected to the power supply voltage source VDD, is free from such fears, and is thus suitable particularly for the realization of a column-parallel single slope AD converter.
[Fourth Example of Circuit Configuration]

Figure 34:
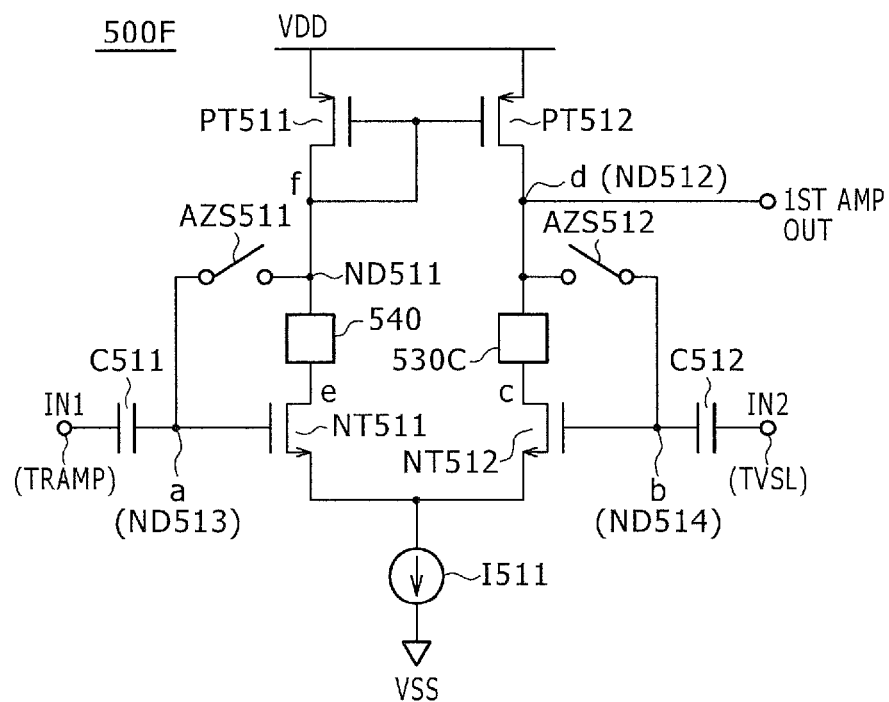
FIG. 34 is a diagram showing a fourth example of circuit configuration of a comparator capable of reducing low-frequency noise according to the present embodiment.

FIG. 34 is a diagram showing a fourth example of circuit configuration of a comparator capable of reducing low-frequency noise according to the present embodiment.

The comparator 500F of FIG. 34 is different from the comparator 500C of FIG. 31 as follows.

The comparator 500F further includes a second isolator 540 disposed between a node ND511 (node f) on a load side and the drain terminal (node e) side of an NMOS transistor NT511 forming an NMOS differential pair (Gm amplifier).

The node e has a low impedance, with a PMOS load forming a diode connection, that is, the node e is maintained at a substantially constant voltage, so that the isolation does not contribute greatly.

Therefore, the isolation does not need to be provided for the node e.

However, the comparator 500F of FIG. 34 has a high degree of circuit symmetry. The comparator 500F having an auto-zero function is thus capable of realizing comparing operation with higher accuracy.
[Fifth Example of Circuit Configuration]

Figure 35:
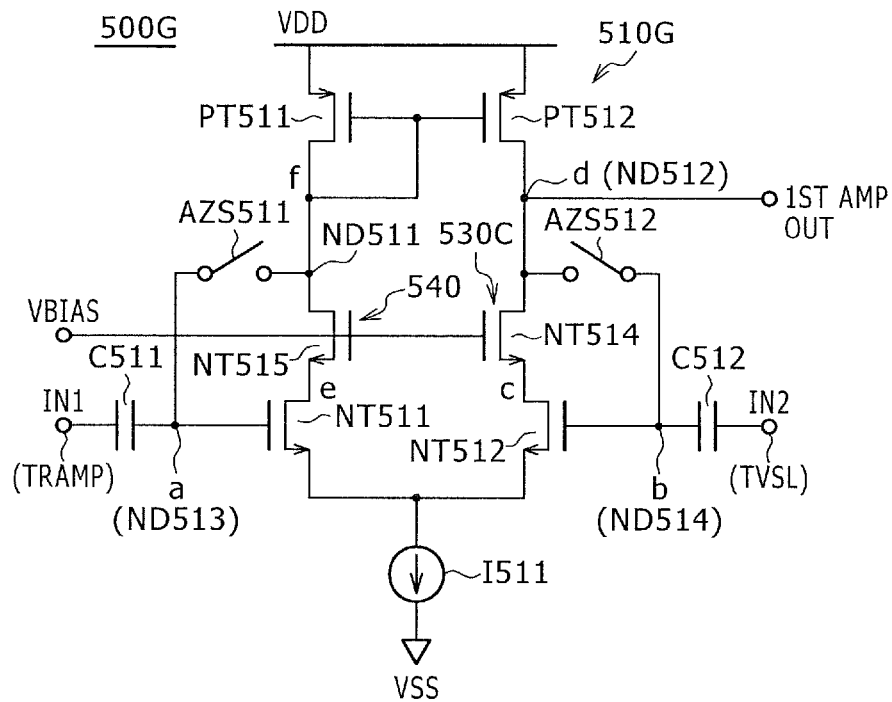
FIG. 35 is a diagram showing a fifth example of circuit configuration of a comparator capable of reducing low-frequency noise according to the present embodiment.

FIG. 35 is a diagram showing a fifth example of circuit configuration of a comparator capable of reducing low-frequency noise according to the present embodiment.

In the comparator 500G of FIG. 35, the isolator 540 in the comparator 500F of FIG. 34 is formed by an NMOS transistor NT515.

The drain of the NMOS transistor NT515 is connected to the load side node ND511 (node f) of a first amplifier 510G. The source of the NMOS transistor NT515 is connected to the drain (node e) of an NMOS transistor NT511 forming a Gm amplifier.

In the comparator 500G of FIG. 35, the gate of an NMOS transistor NT514 forming an isolator 530C and the gate of the NMOS transistor NT515 forming the isolator 540 are connected to a line for supplying a bias voltage VBIAS.

A fixed current thereby flows through the NMOS transistor NT514. Thus, even when there is a parasitic capacitance between the gate (input node b) and the drain (output node c) of an NMOS transistor NT512, voltage variations are suppressed, and low-frequency noise is reduced.

Similarly, a fixed current thereby flows through the NMOS transistor NT515. Thus, even when there is a parasitic capacitance between the gate (input node a) and the drain (output node e) of the NMOS transistor NT511, voltage variations are suppressed, and low-frequency noise is reduced.

Also in this case, the transistor used for isolation is not limited to the same type as that of the transistors of the differential pair.
[Sixth Example of Circuit Configuration]

Figure 36:
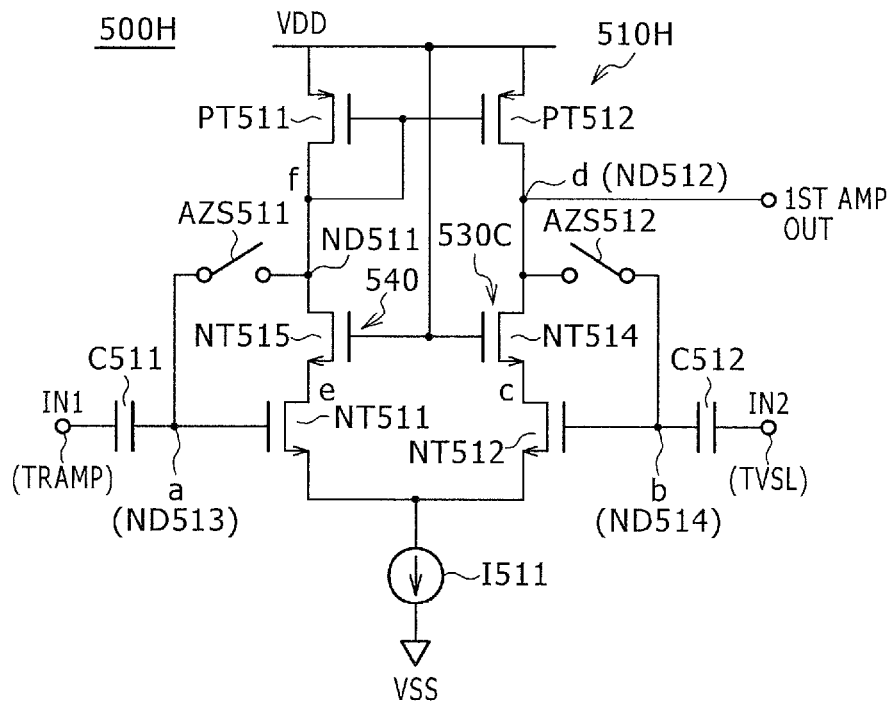
FIG. 36 is a diagram showing a sixth example of circuit configuration of a comparator capable of reducing low-frequency noise according to the present embodiment.

FIG. 36 is a diagram showing a sixth example of circuit configuration of a comparator capable of reducing low-frequency noise according to the present embodiment.

The comparator 500H of FIG. 36 is different from the comparator 500G of FIG. 35 as follows.

In the comparator 500H, the gate of an NMOS transistor NT514 of an isolator 530C and the gate of an NMOS transistor NT515 forming an isolator 540 are connected to a power supply voltage source VDD in place of the line for supplying the bias voltage VBIAS.

The comparator 500G of FIG. 35 needs the other bias voltage VBIAS to operate the NMOS transistors NT514 and NT515.

As in the case of the third example of circuit configuration, when the comparator 500G is used in a column-parallel single slope AD converter in a CMOS image sensor or the like, for example, the following fears and the like arise from the necessity of the bias voltage VBIAS:

(1) interference between columns, (2) an increase in VBIAS wiring area, and (3) the necessity of a VBIAS generating circuit.

On the other hand, the comparator 500H of FIG. 36, in which the gates of the NMOS transistors NT514 and NT515 are connected to the power supply voltage source VDD, is free from such fears, and is thus suitable particularly for the realization of a column-parallel single slope AD converter.
[Example of Effective Implementation]

The following description will be made of an example of effective implementation of a comparator capable of reducing low-frequency noise according to the present embodiment.

Figure 37A:
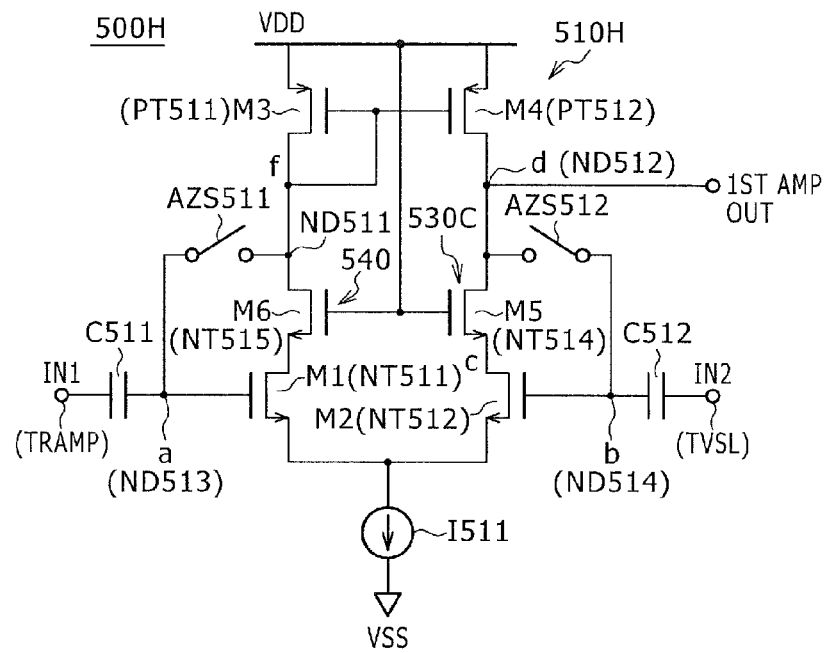
FIGS. 37A and 37B are diagrams of assistance in explaining an example of effective implementation of a comparator capable of reducing low-frequency noise according to the present embodiment.
Figure 37B:
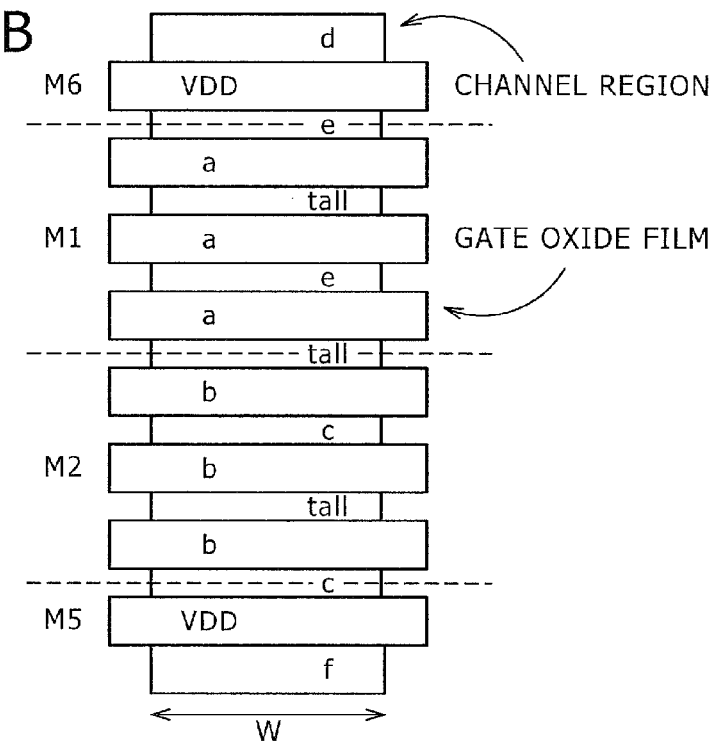

FIGS. 37A and 37B are diagrams of assistance in explaining an example of effective implementation of a comparator capable of reducing low-frequency noise according to the present embodiment.

As shown in FIG. 37A, this implementation example relates to the comparator 500H of FIG. 36 having a high degree of symmetry.

In FIGS. 37A and 37B, NMOS differential pair transistors NT511 and NT512 are indicated by M1 and M2, and isolation transistors NT514 and NT515 are indicated by M5 and M6.

The channel width W of the differential pair transistors M1 and M2 and the channel width W of the isolation transistors M5 and M6 are made to coincide with each other. In addition, the differential pair transistors M1 and M2 are each made to have an odd number of fingers. The isolation transistors M5 and M6 and the differential pair transistors M1 and M2 thereby have a common channel region.

As a result, the channel regions at both ends of the differential pair transistors M1 and M2 are extended naturally. It is known that such an implementation method remedies low-frequency noise such as flicker noise, RTS noise, and the like ("Impact of STA Effect on Flicker Noise in 0.13 um RF nMOSFETs" IEEE TRANSACTIONS ON ELECTRON DEVICES, VOL. 54, NO. 12, DECEMBER 2007, pp. 3383-3392).

Thus, when the present technology is implemented, low-frequency noise can be remedied by the two mechanisms described above (circuit operation and process characteristics).

As described above, according to the present embodiment, the following effects can be obtained.

The present technology can reduce the number of TCVs as compared with existing laminated structures without causing an error in transmitted signals. In addition, the present technology eliminates a need for circuits of quantizers (comparators) on an analog chip. Thus, the area of the analog chip can be reduced to an area determined by a sensor alone.

For example, because the area of an image sensor (pixels) is determined from the optical size of the system, this generally means that the analog chip can be miniaturized to substantially a limit where the analog chip can be minimized.

As described above, there are a larger number of processes for the analog chip than for a logic chip (digital chip). The cost of the analog chip is therefore higher than that of the logic chip (digital chip) even when the chips have the same area.

In addition, the present technology can limit circuits to be disposed on the analog chip to parts relating to the sensor, and can therefore omit processes relating to wiring and transistor manufacturing. In general, transistors for fabricating the circuits of the comparators and the like and transistors for forming the sensor are manufactured in processes including processes not common to the transistors for fabricating the circuits of the comparators and the like and the transistors for forming the sensor. Thus, the absence of the circuits of the comparators and the like can reduce these processes.

Similarly, because complex wiring does not need to be disposed on the analog chip, a total number of pieces of wiring can be reduced.

For the two reasons described above, the present technology can greatly reduce the cost of the semiconductor device without degrading signals output from the sensor.

In addition, as described above, the comparators 500C to 500H according to the present embodiment have a configuration for reducing noise using cascode transistors.

These configurations can reduce the input-converted noise of the comparators by avoiding the attenuation of an effective input signal amplitude due to coupling between the output node and the input node when comparing a slope signal, for example a ramp signal.

Thus, noise, or low-frequency noise such as flicker noise, RTS noise, and the like in particular, can be reduced in the comparator provided with an auto-zero function as well as a single slope AD converter and a solid-state imaging device using the comparator.

Incidentally, a great noise reduction effect is obtained when the comparator having such a characteristic is applied to the second chip as the digital chip in the laminated structure of FIG. 9.

However, a great noise reduction effect is obtained even when the comparator is mounted on the side of the first chip as an analog chip and in a case of a circuit configuration that is not of a laminated structure.

Then, as described above, noise, or low-frequency noise such as flicker noise, RTS noise, and the like in particular, can be reduced in a single slope AD converter and a solid-state imaging device using the comparator provided with an auto-zero function.

Incidentally, in the present embodiment, description has been made of the configuration of a CMOS image sensor as an example of a semiconductor device. The above-described configuration can be applied to a back side illumination type CMOS image sensor to exert each of the effects described above. However, each of the effects described above can be fully exerted even in a case of a front side illumination type.

A solid-state imaging device having such a configuration can be applied as an imaging device in digital cameras and video cameras.

<4. Example of Configuration of Camera System>

Figure 38:
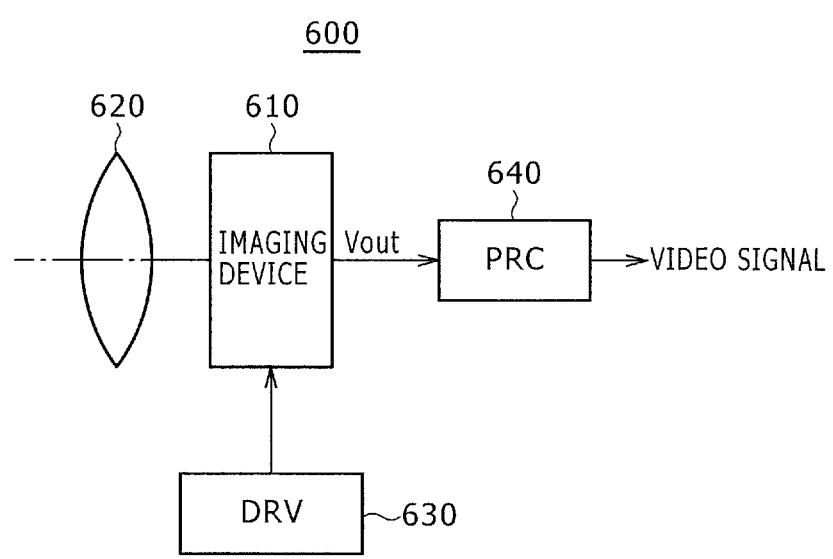
FIG. 38 is a diagram showing an example of configuration of a camera system to which a solid-state imaging device according to the present embodiment is applied.

FIG. 38 is a diagram showing an example of configuration of a camera system to which a solid-state imaging device according to the present embodiment is applied.

As shown in FIG. 38, the present camera system 600 has an imaging device 610 to which the CMOS image sensors (solid-state imaging devices) 200, 300, and 300A to 300C according to the present embodiment can be applied.

The camera system 600 further includes an optical system for guiding incident light to the pixel region of the imaging device 610 (for forming a subject image), for example a lens 620 for forming an image of the incident light (image light) on an imaging surface.

The camera system 600 includes a driving circuit (DRV) 630 for driving the imaging device 610 and a signal processing circuit (PRC) 640 for processing the output signal of the imaging device 610.

The driving circuit 630 has a timing generator (not shown) for generating various kinds of timing signals including a start pulse and a clock pulse for driving a circuit within the imaging device 610. The driving circuit 630 drives the imaging device 610 by the predetermined timing signals.

In addition, the signal processing circuit 640 subjects the output signal of the imaging device 610 to predetermined signal processing.

The image signal processed by the signal processing circuit 640 is recorded on a recording medium such as a memory, for example. The image information recorded on the recording medium is converted into a hard copy form by a printer or the like. In addition, the image signal processed by the signal processing circuit 640 is shown as a moving image on a monitor formed by a liquid crystal display or the like.

As described above, high-precision cameras can be realized by including the solid-state imaging devices 200, 300, and 300A to 300C described above as the imaging device 610 in imaging devices such as digital still cameras and the like.

Incidentally, the present technology can adopt the following constitutions.

(1) A comparator including:
a first input sampling capacitance;
a second input sampling capacitance;
an output node;

a transconductance (Gm) amplifier as a differential comparator section configured to receive a slope signal, a signal level of the slope signal changing with a slope, at one input terminal of the Gm amplifier via the first input sampling capacitance, and receive an input signal at another input terminal of the Gm amplifier via the second input sampling capacitance, and subject the slope signal and the input signal to comparing operation; and an isolator configured to hold a voltage of an output section of the Gm amplifier constant, the isolator being disposed between the output section of the Gm amplifier and the output node.

(2) The comparator according to the above (1), wherein the Gm amplifier includes differential pair transistors configured to receive the slope signal at a gate of one transistor of the differential pair transistors via the first input sampling capacitance and receive the input signal at a gate of the other transistor of the differential pair transistors via the second input sampling capacitance, and subject the slope signal and the input signal to the comparing operation, a transistor pair on a load side of the differential pair transistors, and an initializing switch configured to determine an operating point at a time of a start of row operation, the initializing switch being connected between the gates and drains of the differential pair transistors, one transistor of the transistor pair on the load side is connected to the output node, and the isolator is connected between an output section of one transistor of the differential pair transistors and the output node.

(3) The comparator according to the above (2), wherein the isolator includes an isolation transistor cascode-connected to one transistor of the differential pair transistors, a gate of the isolation transistor being biased to a predetermined potential.

(4) The comparator according to the above (2) or (3), further including a second isolator configured to hold a voltage of an output section of the other transistor of the differential pair transistors constant, the second isolator being between the output section of the other transistor of the differential pair transistors and a node of connection of another transistor of the transistor pair on the load side.

(5) The comparator according to the above (4), wherein the second isolator includes an isolation transistor cascode-connected to the other transistor of the differential pair transistors, a gate of the isolation transistor being biased to a predetermined potential.

(6) The comparator according to the above (5), wherein the differential pair transistors and the isolation transistor have a common channel region.

(7) The comparator according to the above (3) or (5), wherein the gate of the isolation transistor is connected to a line for supplying a bias voltage.

(8) The comparator according to the above (3) or (5), wherein the gate of the isolation transistor is connected to a power supply voltage source.

(9) An AD converter including:

a comparator configured to subject a slope signal, a signal level of the slope signal changing with a slope, and an input signal to comparison and determination, and output a determination signal based on the determination; and a counter configured to count a comparison time of the comparator, and obtain a digital signal;

wherein the comparator includes a first input sampling capacitance, a second input sampling capacitance, an output node, a transconductance (Gm) amplifier as a differential comparator section configured to receive the slope signal, the signal level of the slope signal changing with the slope, at one input terminal of the Gm amplifier via the first input sampling capacitance, and receive the input signal at another input terminal of the Gm amplifier via the second input sampling capacitance, and subject the slope signal and the input signal to comparing operation, and an isolator configured to hold a voltage of an output section of the Gm amplifier constant, the isolator being disposed between the output section of the Gm amplifier and the output node.

(10) The AD converter according to the above (9), wherein the Gm amplifier includes differential pair transistors configured to receive the slope signal at a gate of one transistor of the differential pair transistors via the first input sampling capacitance and receive the input signal at a gate of the other transistor of the differential pair transistors via the second input sampling capacitance, and subject the slope signal and the input signal to the comparing operation, a transistor pair on a load side of the differential pair transistors, and an initializing switch configured to determine an operating point at a time of a start of row operation, the initializing switch being connected between the gates and drains of the differential pair transistors, one transistor of the transistor pair on the load side is connected to the output node, and the isolator is connected between an output section of one transistor of the differential pair transistors and the output node.

(11) The AD converter according to the above (10), wherein the isolator includes an isolation transistor cascode-connected to one transistor of the differential pair transistors, a gate of the isolation transistor being biased to a predetermined potential.

(12) The AD converter according to the above (10) or (11), further including a second isolator configured to hold a voltage of an output section of the other transistor of the differential pair transistors constant, the second isolator being between the output section of the other transistor of the differential pair transistors and a node of connection of another transistor of the transistor pair on the load side.

(13) The AD converter according to the above (12), wherein the second isolator includes an isolation transistor cascode-connected to the other transistor of the differential pair transistors, a gate of the isolation transistor being biased to a predetermined potential.

(14) The AD converter according to the above (13), wherein the differential pair transistors and the isolation transistor have a common channel region.

(15) The AD converter according to the above (11) or (13), wherein the gate of the isolation transistor is connected to a line for supplying a bias voltage.

(16) The AD converter according to the above (11) or (13), wherein the gate of the isolation transistor is connected to a power supply voltage source.

(17) A solid-state imaging device including:
a pixel array section in which a plurality of pixels configured to perform photoelectric conversion are arranged in a form of a matrix; and
a pixel signal readout section configured to read out pixel signals in a plurality of pixel units from the pixel array section;
wherein the pixel signal readout section includes
a plurality of comparators configured to subject a readout signal potential and a slope signal, a signal level of the slope signal changing with a slope, to comparison and determination, and output a determination signal based on the determination, the plurality of comparators being disposed so as to correspond to a column arrangement of the pixels, and
a plurality of counters configured to count comparison times of the corresponding comparators, and obtain digital signals,
each of the comparators including
a first input sampling capacitance,
a second input sampling capacitance,
an output node,
a transconductance (Gm) amplifier as a differential comparator section configured to receive the slope signal, the signal level of the slope signal changing with the slope, at one input terminal of the Gm amplifier via the first input sampling capacitance, and receive an input signal at another input terminal of the Gm amplifier via the second input sampling capacitance, and subject the slope signal and the input signal to comparing operation, and
an isolator configured to hold a voltage of an output section of the Gm amplifier constant, the isolator being disposed between the output section of the Gm amplifier and the output node.

(18) The solid-state imaging device according to the above (17), further including:
a first chip; and
a second chip;
wherein the first chip and the second chip have a laminated structure formed by laminating the first chip and the second chip,
the pixel array section and a signal line for transmitting a time-discretized analog pixel signal are arranged in the first chip,
the pixel signal readout section is disposed in the second chip, and
wiring between the first chip and the second chip is connected through a via.

(19) A camera system including:
a solid-state imaging device; and
an optical system configured to form a subject image on the solid-state imaging device;
wherein the solid-state imaging device includes
a pixel array section in which a plurality of pixels configured to perform photoelectric conversion are arranged in a form of a matrix, and
a pixel signal readout section configured to read out pixel signals in a plurality of pixel units from the pixel array section,
the pixel signal readout section including a plurality of comparators configured to subject a readout signal potential and a slope signal, a signal level of the slope signal changing with a slope, to comparison and determination, and output a determination signal based on the determination, the plurality of comparators being disposed so as to correspond to a column arrangement of the pixels, and
a plurality of counters configured to count comparison times of the corresponding comparators, and obtain digital signals, and
each of the comparators including
a first input sampling capacitance,
a second input sampling capacitance,
an output node,
a transconductance (Gm) amplifier as a differential comparator section configured to receive the slope signal, the signal level of the slope signal changing with the slope, at one input terminal of the Gm amplifier via the first input sampling capacitance, and receive an input signal at another input terminal of the Gm amplifier via the second input sampling capacitance, and subject the slope signal and the input signal to comparing operation, and
an isolator configured to hold a voltage of an output section of the Gm amplifier constant, the isolator being disposed between the output section of the Gm amplifier and the output node.

The present disclosure contains subject matter related to that disclosed in Japanese Priority Patent Application JP 2011-232283 filed in the Japan Patent Office on Oct. 21, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A comparator comprising:
a first input sampling capacitance;
a second input sampling capacitance;
an output node;
a transconductance (Gm) amplifier as a differential comparator section configured to receive a slope signal, a signal level of the slope signal changing with a slope, at one input terminal of the Gm amplifier via the first input sampling capacitance, and receive an input signal at another input terminal of the Gm amplifier via the second input sampling capacitance, and subject the slope signal and the input signal to comparing operation; and
an isolator configured to hold a voltage of an output section of the Gm amplifier constant, the isolator being disposed between the output section of the Gm amplifier and the output node.

2. The comparator according to claim 1,
wherein the Gm amplifier includes
differential pair transistors configured to receive the slope signal at a gate of one transistor of the differential pair transistors via the first input sampling capacitance and receive the input signal at a gate of the other transistor of the differential pair transistors via the second input sampling capacitance, and subject the slope signal and the input signal to the comparing operation,
a transistor pair on a load side of the differential pair transistors, and
an initializing switch configured to determine an operating point at a time of a start of row operation, the initializing switch being connected between the gates and drains of the differential pair transistors,
one transistor of the transistor pair on the load side is connected to the output node, and the isolator is connected between an output section of one transistor of the differential pair transistors and the output node.

3. The comparator according to claim 2,
wherein the isolator includes an isolation transistor cascode-connected to one transistor of the differential pair transistors, a gate of the isolation transistor being biased to a predetermined potential.

4. The comparator according to claim 3,
wherein the gate of the isolation transistor is connected to a line for supplying a bias voltage.

5. The comparator according to claim 3,
wherein the gate of the isolation transistor is connected to a power supply voltage source.

6. The comparator according to claim 2, further comprising a second isolator configured to hold a voltage of an output section of the other transistor of the differential pair transistors constant, the second isolator being between the output section of the other transistor of the differential pair transistors and a node of connection of another transistor of the transistor pair on the load side.

7. The comparator according to claim 6,
wherein the second isolator includes an isolation transistor cascode-connected to the other transistor of the differential pair transistors, a gate of the isolation transistor being biased to a predetermined potential.

8. The comparator according to claim 7,
wherein the differential pair transistors and the isolation transistor have a common channel region.

9. An analog-digital converter comprising:
a comparator configured to subject a slope signal, a signal level of the slope signal changing with a slope, and an input signal to comparison and determination, and output a determination signal based on the determination; and
a counter configured to count a comparison time of the comparator, and obtain a digital signal;
wherein the comparator includes
a first input sampling capacitance,
a second input sampling capacitance,
an output node,
a transconductance (Gm) amplifier as a differential comparator section configured to receive the slope signal, the signal level of the slope signal changing with the slope, at one input terminal of the Gm amplifier via the first input sampling capacitance, and receive the input signal at another input terminal of the Gm amplifier via the second input sampling capacitance, and subject the slope signal and the input signal to comparing operation, and
an isolator configured to hold a voltage of an output section of the Gm amplifier constant, the isolator being disposed between the output section of the Gm amplifier and the output node.

10. The analog-digital converter according to claim 9,
wherein the Gm amplifier includes
differential pair transistors configured to receive the slope signal at a gate of one transistor of the differential pair transistors via the first input sampling capacitance and receive the input signal at a gate of the other transistor of the differential pair transistors via the second input sampling capacitance, and subject the slope signal and the input signal to the comparing operation,
a transistor pair on a load side of the differential pair transistors, and
an initializing switch configured to determine an operating point at a time of a start of row operation, the initializing switch being connected between the gates and drains of the differential pair transistors,
one transistor of the transistor pair on the load side is connected to the output node, and
the isolator is connected between an output section of one transistor of the differential pair transistors and the output node.

11. The analog-digital converter according to claim 10,
wherein the isolator includes an isolation transistor cascode-connected to one transistor of the differential pair transistors, a gate of the isolation transistor being biased to a predetermined potential.

12. The analog-digital converter according to claim 11,
wherein the gate of the isolation transistor is connected to a line for supplying a bias voltage.

13. The analog-digital converter according to claim 11,
wherein the gate of the isolation transistor is connected to a power supply voltage source.

14. The analog-digital converter according to claim 10, further comprising a second isolator configured to hold a voltage of an output section of the other transistor of the differential pair transistors constant, the second isolator being between the output section of the other transistor of the differential pair transistors and a node of connection of another transistor of the transistor pair on the load side.

15. The analog-digital converter according to claim 14,
wherein the second isolator includes an isolation transistor cascode-connected to the other transistor of the differential pair transistors, a gate of the isolation transistor being biased to a predetermined potential.

16. The analog-digital converter according to claim 15,
wherein the differential pair transistors and the isolation transistor have a common channel region.

17. A solid-state imaging device comprising:
a pixel array section in which a plurality of pixels configured to perform photoelectric conversion are arranged in a form of a matrix; and
a pixel signal readout section configured to read out pixel signals in a plurality of pixel units from the pixel array section;
wherein the pixel signal readout section includes
a plurality of comparators configured to subject a readout signal potential and a slope signal, a signal level of the slope signal changing with a slope, to comparison and determination, and output a determination signal based on the determination, the plurality of comparators being disposed so as to correspond to a column arrangement of the pixels, and
a plurality of counters configured to count comparison times of the corresponding comparators, and obtain digital signals,
each of the comparators including
a first input sampling capacitance,
a second input sampling capacitance,
an output node,
a transconductance (Gm) amplifier as a differential comparator section configured to receive the slope signal, the signal level of the slope signal changing with the slope, at one input terminal of the Gm amplifier via the first input sampling capacitance, and receive an input signal at another input terminal of the Gm amplifier via the second input sampling capacitance, and subject the slope signal and the input signal to comparing operation, and an isolator configured to hold a voltage of an output section of the Gm amplifier constant, the isolator being disposed between the output section of the Gm amplifier and the output node.

18. The solid-state imaging device according to claim 17, further comprising:
   a first chip; and
   a second chip;
   wherein the first chip and the second chip have a laminated structure formed by laminating the first chip and the second chip,
   the pixel array section and a signal line for transmitting a time-discretized analog pixel signal are arranged in the first chip,
   the pixel signal readout section is disposed in the second chip, and
   wiring between the first chip and the second chip is connected through a via.

19. A camera system comprising:
   a solid-state imaging device; and
   an optical system configured to form a subject image on the solid-state imaging device;
   wherein the solid-state imaging device includes
      a pixel array section in which a plurality of pixels configured to perform photoelectric conversion are arranged in a form of a matrix, and
      a pixel signal readout section configured to read out pixel signals in a plurality of pixel units from the pixel array section,
      the pixel signal readout section including
      a plurality of comparators configured to subject a readout signal potential and a slope signal, a signal level of the slope signal changing with a slope, to comparison and determination, and output a determination signal based on the determination, the plurality of comparators being disposed so as to correspond to a column arrangement of the pixels, and
      a plurality of counters configured to count comparison times of the corresponding comparators, and obtain digital signals, and
      each of the comparators including
      a first input sampling capacitance,
      a second input sampling capacitance,
      an output node,
      a transconductance (Gm) amplifier as a differential comparator section configured to receive the slope signal, the signal level of the slope signal changing with the slope, at one input terminal of the Gm amplifier via the first input sampling capacitance, and receive an input signal at another input terminal of the Gm amplifier via the second input sampling capacitance, and subject the slope signal and the input signal to comparing operation, and
      an isolator configured to hold a voltage of an output section of the Gm amplifier constant, the isolator being disposed between the output section of the Gm amplifier and the output node.

* * * * *